United States Patent [19]
Diorio et al.

[11] Patent Number: 5,990,512
[45] Date of Patent: *Nov. 23, 1999

[54] HOLE IMPACT IONIZATION MECHANISM OF HOT ELECTRON INJECTION AND FOUR-TERMINAL pFET SEMICONDUCTOR STRUCTURE FOR LONG-TERM LEARNING

[75] Inventors: Christopher J. Diorio, Torrance; Paul E. Hasler, Pasadena; Bradley A. Minch, Pasadena; Carver A. Mead, Pasadena, all of Calif.

[73] Assignee: California Institute of Technology, Pasadena, Calif.

[*] Notice: This patent is subject to a terminal disclaimer.

[21] Appl. No.: 08/845,018

[22] Filed: Apr. 22, 1997

Related U.S. Application Data

[63] Continuation-in-part of application No. 08/399,966, Mar. 7, 1995, Pat. No. 5,627,392, application No. 08/690,198, Jul. 26, 1996, Pat. No. 5,825,063, and application No. 08/721,261, Sep. 26, 1996, Pat. No. 5,875,126
[60] Provisional application No. 60/022,360, Jul. 24, 1996, and provisional application No. 60/016,464, Apr. 29, 1996.

[51] Int. Cl.$^6$ .................................................. H01L 29/76
[52] U.S. Cl. ........................ 257/314; 257/315; 257/316; 257/318; 257/321; 257/322; 257/326; 257/391
[58] Field of Search .................................. 257/314, 315, 257/316, 318, 321, 322, 326, 391

[56] References Cited

U.S. PATENT DOCUMENTS

| | | | |
|---|---|---|---|
| 3,893,151 | 7/1975 | Bosselaar et al. | 357/23 |
| 4,420,871 | 12/1983 | Scheibe | 29/571 |
| 4,622,656 | 11/1986 | Kamiya et al. | 365/185 |
| 4,822,750 | 4/1989 | Perlegos et al. | 437/52 |
| 4,935,702 | 6/1990 | Mead et al. | 330/9 |
| 4,953,928 | 9/1990 | Anderson et al. | 357/23.5 |
| 5,059,920 | 10/1991 | Anderson et al. | 330/253 |
| 5,068,622 | 11/1991 | Mead et al. | 330/253 |
| 5,160,899 | 11/1992 | Anderson et al. | 330/288 |
| 5,166,562 | 11/1992 | Allen et al. | 307/571 |
| 5,331,215 | 7/1994 | Allen et al. | 307/201 |
| 5,336,936 | 8/1994 | Allen et al. | 307/201 |
| 5,345,418 | 9/1994 | Challa | 365/185 |
| 5,463,348 | 10/1995 | Sarpeshkar et al. | 330/253 |
| 5,627,392 | 5/1997 | Diorio et al. | 257/315 |
| 5,687,118 | 11/1997 | Chang | 365/118.19 |
| 5,763,912 | 6/1998 | Parat et al. | 257/315 |
| 5,777,361 | 7/1998 | Parris et al. | 257/322 |

OTHER PUBLICATIONS

Diorio, et al., "A High–Resolution Non–Volatile Analog Memory Cell," 1995, IEEE Intl. Symp. on Circuits and Systems, vol. 3, pp. 2233–2236.

(List continued on next page.)

*Primary Examiner*—William Mintel
*Attorney, Agent, or Firm*—D'Alessandro & Ritchie

[57] ABSTRACT

Hot-electron injection driven by a hole impact ionization mechanism at the channel-drain junction provides a new method of hot electron injection. Using this mechanism, a four-terminal pFET floating-gate silicon MOS transistor for analog learning applications provides nonvolatile memory storage. Electron tunneling permits bidirectional memory updates. Because these updates depend on both the stored memory value and the transistor terminal voltages, the synapses can implement a learning function. The synapse learning follows a simple power law. Unlike conventional EEPROMs, the synapses allow simultaneous memory reading and writing. Synapse transistor arrays can therefore compute both the array output, and local memory updates, in parallel. Synaptic arrays employing these devices enjoy write and erase isolation between array synapses is better than 0.01% because the tunneling and injection processes are exponential in the transistor terminal voltages. The synapses are small, and typically are operated at subthreshold current levels.

33 Claims, 14 Drawing Sheets

OTHER PUBLICATIONS

Gray, et al., "Analysis and Design of Analog Integrated Circuits", 1984, John Wiley & Sons, pp. 67–71.

Hasler, et al., "An Autozeroing Amplifier Using PFET Hot–Electron Injection", May 12–15 1996, IEEE International Symposium on Circuits and Systems, vol. 3.

Hasler, et al., "An Autozeroing Floating–Gate Amplifier", IEEE Journal of Solid State Circuits, pp. 1–15, May/Jun. 1997.

Hasler, et al., "Single Transistor Learning Synapse", 1995, Advances in Neural Information Processing Systems 7, MIT Press, pp. 817–824.

Hasler, et al., "Single Transistor Learning Synapse with Long Term Storage," 1995, IEEE Intl. Symp. on Circuits and Systems, vol. 3, pp. 1660–1663.

Hochet, et al., "Implementation of a Learning Kohonen Neuron Based on a New Multilevel Storage Technique", Mar. 1991, IEEE J. Solid–State Circuits, vol. 26, No. 3, pp. 262–267.

Hollis, et al., "A Neural Network Learning Algorithm Tailored for VLSI Implementation", Sep. 1994, IEEE Trans. on Neural Networks, vol. 5, No. 5, pp. 784–791.

Hu, et al., "Hot–Electron–Induced MOSFET Degradation—Model, Monitor, and Improvement", Feb. 1985, IEEE Transactions on Electron Devices, vol. ED–32, No. 2, pp. 375–385.

Ismail, "Neural Information Processing II," 1994, Analog VLSI Signal and Information Process, New York: McGraw–Hill, Inc., pp. 358–413.

Johnson, "Neural Team Bares Silicon Brain", Jul. 3, 1995, Electronic Engineering Times, pp. 1 and 31.

Johnson, "Mead Envisions New Design Era", Jul. 17, 1995, Electronic Engineering Times, pp. 1, 37, 38.

Lazzaro, et al., "Winner–Take–All Networks of O(N) Complexity," 1989, in D. S. Touretzky, ed., Advances in Neural Informational Processing Systems 1, San Mateo, CA; Morgan Kaufmann, pp. 703–711.

Lazzaro, et al., "Systems Technologies for Silicon Auditory Models," Jun. 1994, IEEE Micro, vol. 14, No. 3, pp. 7–15, T.

Leblebici, et al., "Hot–Carrier Reliability of MOS VLSI Circuits", 1993, Kluwer Academic, 46–49.

Masuoka, et al., "Reviews and Prospects of Non–Volatile Semiconductor Memories," Apr. 1991, IEICE Trans., vol. E 74, No. 4, pp. 868–874.

Mead, et al., Introduction to VLSI Systems, Addison–Wesley Pub. Co., 1980, pp. 1–5.

Mead, "Analog VLSI and Neural Systems", Addison–Wesley Pub. Co., pp. 163–173, 1995.

Minch, "A vMOS Soft–Maximum Current Mirror," 1995 IEEE, vol. 3, pp. 2249–2252.

Minch, et al., "Translinear Circuits Using Subthreshold Floating–Gate MOS Transistors," 1996, Analog Integrated Circuits and Signal Processing, vol. 9, No. 2 pp. 167–179.

Sanchez, et al., "Review of Carrier Injection in the Silicon/Silicon–Dioxide System", Jun. 1991, IEEE Proceedings–G, vol. 138, No. 3, pp. 377–389.

Sarpeshkar, et al., "White Noise in MOS Transistors and Resistors," Nov. 1993, IEEE Circuits and Devices, pp. 23–29.

Sarpeshkar, et al., "A Low–Power Wide–Linear–Range Transconductance Amplifier", Analog Integrated Circuits and Signal Processing, in Press, pp. 1–28, 1996.

Tsividis, et al., "Continuous–Time MOSFET–C Filters in VLSI", Feb. 1986, IEEE Transactions on Circuits and Systems, vol. 33, No. 2, pp. 125–140.

Vittoz, "Dynamic Analog Techniques", 1985, in Y. Tsividis and P. Antognetti, Design of MOS VLSI Circuits for Telecommunications, Prentice Hall, pp. 145–170.

HOLE IMPACT IONIZATION MECHANISM OF HOT ELECTRON INJECTION AND FOUR-TERMINAL pFET SEMICONDUCTOR STRUCTURE FOR LONG-TERM LEARNING

REFERENCE TO RELATED PROVISIONAL PATENT APPLICATION

This application claims the benefit of U.S. Provisional patent application Ser. No. 60/016,464, filed Apr. 29, 1996, and entitled "A COMPLEMENTARY PAIR OF FOUR-TERMINAL SILICON SYNAPSES", the entirety of which is hereby incorporated herein by reference as if set forth in full herein.

CROSS-REFERENCE TO RELATED APPLICATIONS

This application is a continuation-in-part of the following U.S. Patent Applications in the name of the inventors hereof and bearing the serial numbers, filing dates and titles shown below:

| Ser. No. | Filing Date | Title |
| --- | --- | --- |
| 08/399,966 | 07 March 95 | A Semiconductor Structure for Long Term Learning, now U.S. Pat. No. 5,627,392 |
| 08/721,261 | 26 September 96 | An Autozeroing Floating Gate Amplifier, now U.S. Pat. No. 5,875,126 |
| 08/690,198 | 26 July 96 | A Three Terminal Silicon Synaptic Device, now U.S. Pat. No. 5,825,063 |
| 60/022,360 | 24 July 96 | A PMOS Analog EEPROM Cell |

STATEMENT AS TO RIGHTS TO INVENTIONS

The present invention was made with support from the United States Government under Grant number N00014-89-J-1675 awarded by the Office of Naval Research of the department of the Navy and under Grant number N00014-89-J-3083 awarded by the Advanced Research Projects Agency of the Department of Defense. The United States Government has certain rights in the invention.

BACKGROUND OF THE INVENTION

1. Field of the Invention

The present invention is directed to a silicon synaptic device for long-term learning in silicon structures used for performing the learning function in neural networks and like systems. More particularly, the present invention is directed to a single transistor analog floating gate MOS memory device which incorporates a capability for simultaneous memory reading and writing as part of the normal MOS memory device operation and which is suitable for performing long-term learning in silicon integrated circuits. Even more particularly, the present invention is directed to a pFET MOS transistor device having a floating gate and using the mechanism of electron tunneling to remove electrons from the floating gate and the mechanism of hole impact ionization in the channel region of the MOS memory device to liberate electrons for injection into the floating gate.

2. The Background Art

A primary goal of the research leading to the present invention is the development of silicon learning systems. One impediment to achieving this goal has been the lack of a simple circuit element combining nonvolatile analog memory storage with locally computed memory updates. Prior efforts typically used capacitive storage with clocked refresh as described in B. Hochet, et al., "*Implementation of a Learning Kohonen Neuron Based on a New Multilevel Storage Technique,*" IEEE J. Solid-State Circuits, vol. 26, no. 3, pp. 262–267, 1991, or storage of a multi-bit digital equivalent word as described in P. Hollis and J. Paulos, "*A Neural Network Learning Algorithm Tailored for VLSI Implementation,*" IEEE Tran. Neural networks, vol. 5, no. 5, p. 784–791, 1994. Such approaches result in large and complex devices which are usually power hungry. Nonvolatile floating-gate devices, such as EEPROM transistors, typically are optimized for binary-valued data storage rather than analog use (see, e.g., F. Masuoka, R. Shirota, and K. Sakui, "Reviews and prospects of non-volatile semiconductor memories," IEICE Trans.,vol. E 74, no. 4, pp. 868–874, 1991), and do not compute their own memory updates.

To achieve a substantial improvement over current technology silicon learning systems, a single transistor learning device with the following attributes would be very valuable:

1. Non-volatile analog storage;
2. Bi-directional memory writing;
3. Support for simultaneous memory reading and writing;
4. On-chip read/write driver circuitry operating off of a single polarity voltage supply;
5. Low power consumption;
6. Compact size; and
7. Compatibility with standard silicon MOS processing.

Prior art floating gate transistors, which use electrical charge stored on a floating polysilicon gate embedded in an insulator such as silicon dioxide, provide suitable non-volatile analog storage. The charge on such a floating gate is known to remain fixed for periods of many years. Although the advantages of using floating gate transistors as memory elements are well known, J. Lazzaro, et al., "*Systems Technologies for Silicon Auditory Models,*" IEEE Micro, Vol. 14, no. 3, pp. 7–15, 1994, T. Allen, et al., "*Writable Analog Reference Voltage Storage Device,*" U.S. Pat. No. 5,166,562, 1991, their application to silicon learning networks has been limited. The principal reason has been the lack of a suitable bidirectional mechanism for writing the analog memory. Since the gate of a floating gate transistor is completely embedded within an insulator, writing the memory involves moving charge carriers through this insulator. Many mechanisms are known which will move electrons through an insulator. Two of the most common and most easily controlled methods are tunneling and hot-electron injection. The inherent difficulty in performing these operations has been the primary impediment to implementation of floating gate transistors in silicon learning systems.

The difficulty in transporting electrons across the barrier presented by the silicon/oxide interface is depicted in FIG. 1. Surmounting the barrier 10 requires that an electron possess more than about 3.2 eV of energy. At room temperature the probability that semiconductor electrons will possess this energy is exceedingly small. Alternatively, an electron could tunnel through this barrier; however, at the voltages and oxide thicknesses used in conventional silicon MOS processing, the tunneling probability is also exceedingly small.

Fowler-Nordheim tunneling involves applying a voltage across the oxide, as shown in FIG. 2 which enhances the probability of an electron tunneling through it. Tunneling current versus oxide voltage for a 400 Å $SiO_2$ gate oxide typical of a 2 μm MOS process is shown in FIG. 3. Bi-directional currents through the oxide are required to achieve the learning and unlearning functions necessary in a silicon learning cell. Although the tunneling process has no preferred direction, bidirectional tunneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous memory reading and writing.

Single polarity bi-directional tunneling is often used in writing digital EEPROMs. Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog memory cell results in significant memory error.

Hot-electron injection is a process whereby electrons near the surface of a semiconductor acquire more than about 3.2 eV of energy, typically by acceleration in an electric field, and then surmount the silicon/oxide barrier. Once in the silicon dioxide conduction band, an electric field applied across the oxide carries these electrons to the floating gate. There are a number of ways of accomplishing hot-electron injection.

One source for a high electric field is the collector-to-base depletion region of either a vertical or lateral bipolar junction transistor (BJT). An example of a lateral BJT used in a similar application is shown in U.S. Pat. No. 4,953,928 to Anderson, et al. Although this device is suitable for analog learning applications, each learning cell requires both an injection BJT and a MOSFET, the former to effect hot-electron injection and the latter to read the stored charge. A reduction in the number of transistors per cell would be highly desirable.

Another source for a high electric field is in the channel region of a split-gate n-type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel. Unfortunately, since the control gate modulates the injection rate but does not receive the injected charge, the memory cannot be both written and read simultaneously. Such a device is acceptable for digital EEPROMs but is unsuitable for analog learning cell applications.

A third source for high electric field is the drain to source voltage dropped across the channel region of an above-threshold sub-micron n-type MOSFET. The disadvantage of this device is that in order to achieve injection, both the drain and gate voltages must exceed approximately 2.5 volts which results in high channel current and consequent high power consumption.

A fourth source for high electric field is the drain to channel depletion region formed in an n-type MOSFET. In a conventional MOSFET, as depicted in FIGS. 4–5, this field only exists when the drain-to-source voltage exceeds 2.5 volts and the transistor is operated at or near its subthreshold regime. Since subthreshold MOSFET gate voltages are typically less than one volt, electrons injected into the gate oxide encounter a large electric field directed towards the transistor drain, opposing their transport to the floating gate. The resulting charge transfer to the floating gate is negligibly small as can be seen in the FIG. 5 energy band diagram of the transistor of FIG. 4.

Accordingly, there is a need for an improved silicon analog memory cell which can be written and erased, which can be written and read simultaneously, and which can be realized in a single device.

OBJECTS AND ADVANTAGES OF THE INVENTION

Accordingly, it is an object and advantage of the present invention to provide an improved analog memory device.

It is a further object and advantage of the present invention to provide a novel silicon synaptic device.

It is a further object and advantage of the present invention to provide a pFET synaptic device.

It is a further object and advantage of the present invention to provide a four terminal pFET silicon synaptic device for use in silicon learning systems.

It is a further object and advantage of the present invention to provide a hole impact ionization method for generating electrons for oxide injection.

Yet a further object and advantage of the present invention to provide a method of injection electrons into the floating gate of a pFET silicon synaptic device.

It is a further object and advantage of the present invention to provide a single transistor analog memory cell.

It is a further object and advantage of the present invention to provide a memory cell capable of use in an extremely high density memory system.

It is a further object and advantage of the present invention to provide a single transistor analog memory cell that supports simultaneous memory reading and writing.

It is a further object and advantage of the present invention to provide a single transistor analog memory cell with a time-varying transfer function that is a component in the circuit used to write its own memory where the time-varying transfer function implements a learning function.

It is a further object and advantage of the present invention to provide a single transistor analog memory cell with a time-varying transfer function that is a component in the circuit used to write its own memory where the time-varying transfer function implements a learning function and the learning function defines a learning rule which can be used in the development of learning systems.

It is a further object and advantage of the present invention to provide a single transistor analog memory cell which can support a feedback loop-type writing mechanism.

It is a further object and advantage of the present invention to provide a single transistor four-terminal device for storing analog values.

It is a further object and advantage of the present invention to provide a single transistor four-terminal device for manipulating stored values.

Yet a further object and advantage of the present invention is to provide an extremely low power, compact, analog memory device which can be incorporated into existing silicon integrated circuits and process.

These and many other objects and advantages of the present invention will become apparent to those of ordinary skill in the art from a consideration of the drawings and ensuing description of the invention.

SUMMARY OF THE INVENTION

The present invention is a silicon MOS transistor suitable for learning applications and as a long-term memory storage device. It is presently embodied as a four-terminal pFET MOS transistor device.

The present invention has a time-varying transfer function. By changing this transfer function the device can adapt to its environment; this is the essence of learning. By providing non-volatile memory storage, the device can indefinitely retain the information that it has learned, thereby providing a long term memory capability. It is useful as: an analog memory cell; in systems that learn signal correlations; in systems that adapt to changing environmental stimuli; and as a silicon analogue of a biological neural synapse.

The present invention achieves a time-varying transfer function by adding and removing charge from the floating gate of a p-type MOS floating gate transistor. It has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection driven by a novel hole impact ionization process in the channel of the pFET. The present invention achieves non-volatile memory by storing charge on the fully insulated floating gate of a p-type MOS floating gate transistor.

Fowler-Nordheim tunneling is used to remove electrons from the floating gate by applying a high voltage to a tunneling junction consisting of an n− type doped silicon region in the p− type substrate, said n− type region suitably constructed to prevent breakdown to the p− type substrate when a high tunneling voltage is applied. In the present implementation, the tunneling junction consists of an n+ doped implant embedded within a lightly-doped n− well within a p− substrate. The application of a high voltage removes electrons from the floating gate at a rate exponential with oxide voltage. When the high voltage is removed, the tunneling rate becomes negligibly small.

Hot-electron injection is used to add electrons to the floating gate as follows: The pFET channel current is holes—channel holes are accelerated in the channel-to-drain depletion region of a subthreshold pFET. A fraction of these holes collide with the semiconductor lattice at energies sufficient to liberate additional electron-hole pairs. The ionized electrons, promoted to their conduction band by the collision, are expelled from the drain by the channel-to-drain E-field. If these ionized electrons are expelled with more than about 3.2 eV of kinetic energy, then they can be injected onto the floating gate. The device remains a fully functional MOS transistor.

The hot-electron injection rate varies with the transistor drain voltage and channel current. Drain voltage is typically used to enable or disable the injection process. For drain to source voltages of magnitude exceeding about 5 volts, electrons are injected onto the floating gate. For drain to source voltages of magnitude less than about 5 volts, the injection rate is negligibly small.

Hence, mechanisms are provided for adding electrons to and removing electrons from the floating gate resulting in a bidirectional memory writing capability. Electron injection is used to add electrons, electron tunneling is used to remove them. When the injection rate is greater than the tunneling rate, electrons are added to the floating gate, and the stored charge is reduced. When the tunneling rate is greater than the injection rate, electrons are removed, and the stored charge is increased.

Mechanisms are also provided by which to disable both processes, thereby retaining the stored, non-volatile analog memory. Furthermore, the device remains a fully functional p-type MOS transistor. The application of proper voltages to its drain, source and control gate terminals allows the reading of either its channel current or channel conductance, both of which are functions of its stored memory. These same terminal voltages determine whether the stored memory is being increased, decreased or held static. Therefore, simultaneous reading and writing is possible.

Accordingly, a single transistor non-volatile analog learning device is provided.

BRIEF DESCRIPTION OF THE DRAWINGS

FIGS. 6A and 6C are drawn to scale; the vertical scale in FIG. 6B has been exaggerated for clarity. All voltages in the conduction-band diagram are referenced to the source potential, and subthreshold ($I_S$<100 nA) operation is assumed. Although in the band diagram the gate oxide actually projects into the plane of the page, for convenience it has been rotated 90° and drawn in the channel direction. We enlarged the floating and control gates in the test device, to increase the capacitive coupling between them.

FIGS. 7A and 7C are drawn to scale, the vertical scale in FIG. 7B has been exaggerated, the voltages in the conduction-band diagram are referenced to the source potential, and subthreshold ($I_X$<100 nA) operation is assumed. Whereas the tunneling process is identical to the nFET synapse, the injection process is quite different. Because the charge carriers are holes, electrons are generated by means of hole impact ionization at the drain. We enlarged the floating and control gates in the test device, to increase the coupling between them.

DESCRIPTION OF THE PREFERRED EMBODIMENTS

Figure 1:
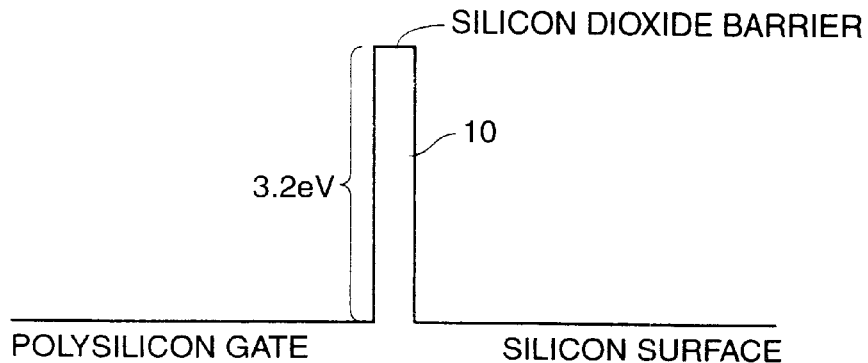
FIG. 1 is an energy band diagram showing the potential barrier faced by a conduction electron at a silicon/oxide interface.
Figure 2:
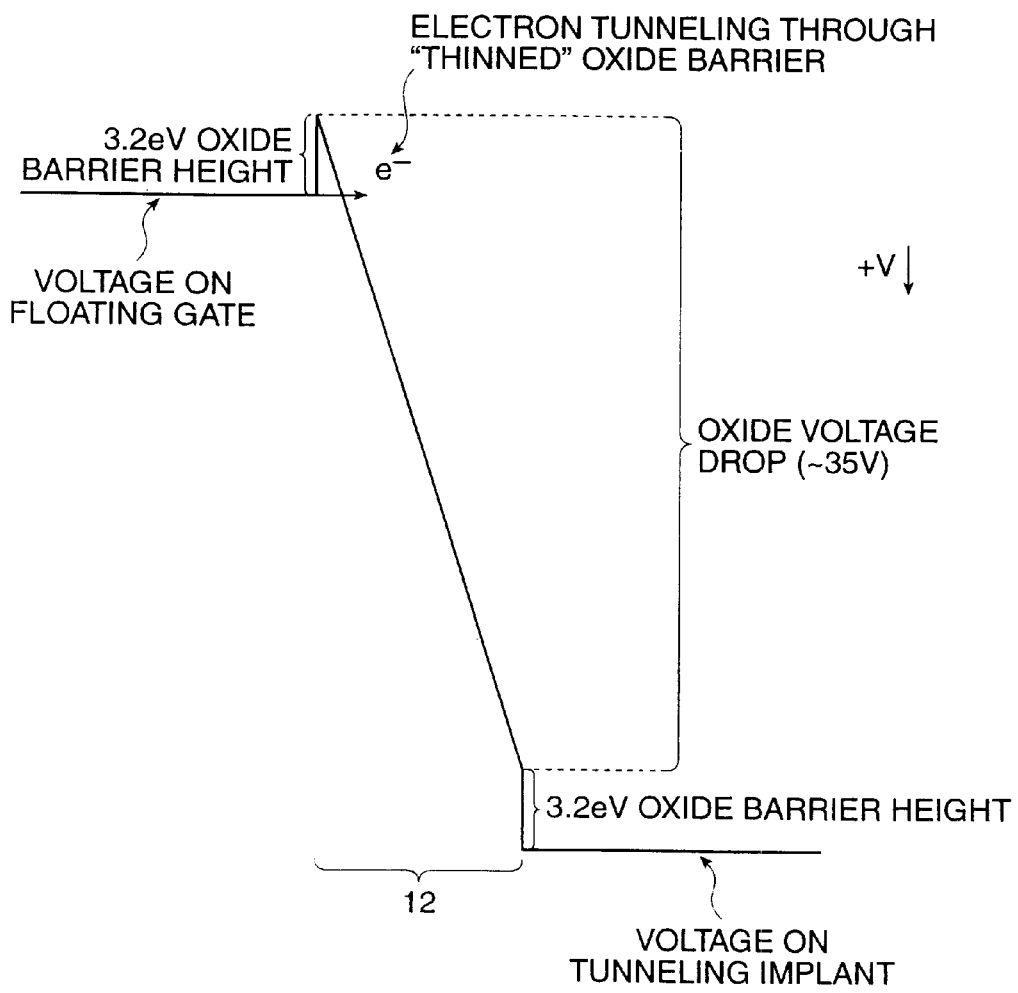
FIG. 2 is an energy band diagram showing the potential faced by an electron in silicon attempting to pass through a silicon dioxide barrier in the presence of a Fowler-Nordheim tunneling potential.
Figure 3:
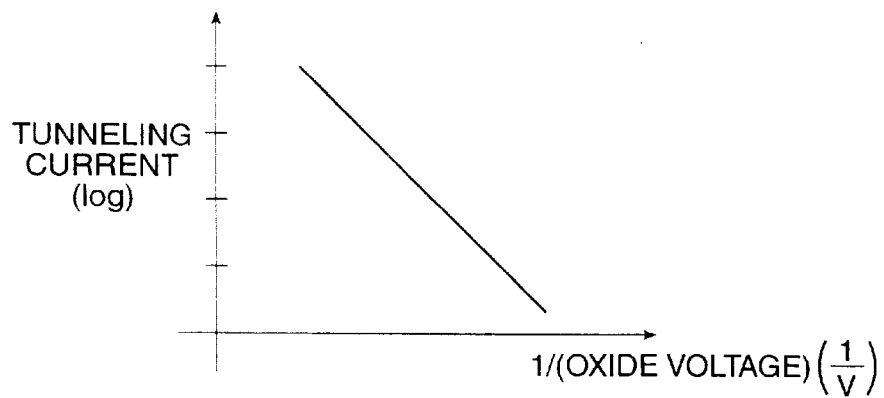
FIG. 3 is a diagram showing a semi-log plot of tunneling current versus oxide voltage for a gate oxide tunneling junction.
Figure 4:
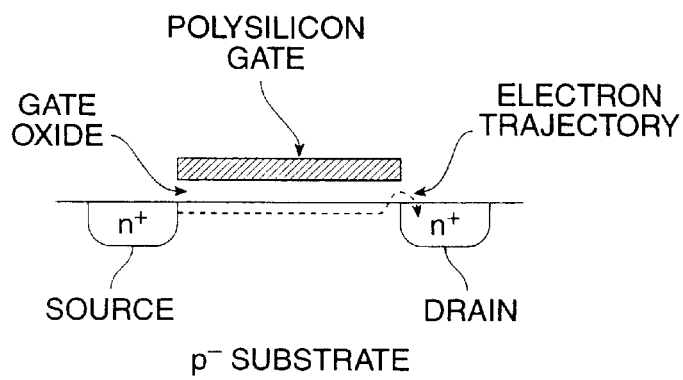
FIG. 4 is a diagram of an n-type MOSFET showing the inability to inject electrons from the channel to the gate.
Figure 5:
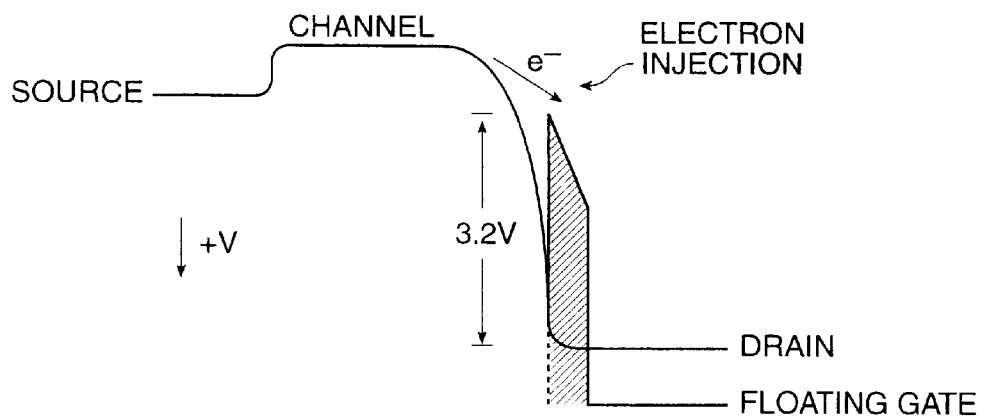
FIG. 5 is an energy band diagram of the conventional n-type MOSFET described in FIG. 4.

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to synapse transistors that not only possess nonvolatile analog memory storage, and compute locally their own memory updates, but also permit simultaneous memory reading and writing, and compute locally the product of the stored memory value and the applied input. To ensure nonvolatile memory, standard floating-gate transistors are employed; in addition, the physical processes that write the memory are adapted to perform a learning function. Although the $SiO_2$ electron transport still is difficult, and does require high voltages, because these devices integrate both memory storage and local computation within a single device, they will find wide application in silicon learning systems.

These devices are called silicon synapses because, like a neural synapse they compute the product of the stored analog memory value and the applied input. Also like the neural synapse, they can learn from the input signal, without interrupting the ongoing computation. Although no single transistor can model completely the complex behavior of a biological neural synapse, the single-transistor synapses described herein do implement a learning function. With them, autonomous learning systems can be built in which both the system outputs, and the memory updates, are computed locally and in parallel.

While this disclosure is primarily directed to the 4-terminal pFET silicon synapse, the 4-terminal nFET silicon synapse will also be described so as to explain the differences between the two structures. The 4-terminal nFET silicon synapse is the subject of U.S. patent application Ser. No. 081399,966 filed Mar. 7, 1995 in the name of the same inventors and same assignee.

The Synapses

The nFET and pFET synapses each possess a poly-1 floating gate, a poly-2 control gate, and a lightly doped n-well tunneling implant. Both synapses use hot-electron injection (see, e.g., E. Takeda, C. Yang, and A. Miura- Hamada, "*Hot-Carrier Effects in MOS Devices,*" San Diego, Calif.; Academic Press, Inc., 1995) to add electrons to their floating gates, and Fowler-Nordheim (FN) tunneling (see, e.g., M. Lenzlinger and E. H. Snow, "*Fowler-Nordheim tunneling into thermally grown SiO$_2$,*" *J. Of Appl. Phys.*, vol. 40, no. 6, pp. 278–283, 1969) to remove the electrons. The nFET synapse differs from a conventional n-type MOSFET by its use of a moderately-doped channel implant. This implant facilitates hot-electron injection in the nFET. The pFET synapse, by contrast, achieves a sufficient hot-electron gate-current using a conventional p– type MOSFET; no special channel implant is required. Both synapses have been fabricated in the 2μm n-well Orbit BiCMOS process available from MOSIS.

In both synapses, the memory is stored as floating-gate charge. Either channel current or channel conductance can be selected as the synapse output. Inputs typically are applied to the poly-2 control gate, which capacitively couples to the poly-1 floating gate. From the control gate's perspective, altering the floating-gate charge shifts the transistor's threshold voltage $V_t$, enabling the synapse output to vary despite a fixed-amplitude control-gate input.

These devices are typically operated in their subthreshold regime (see, e.g., C. Mead, "*Analog VLSI and Neural Systems,*" Reading, Md.; Addison-Wesley, Inc., 1989) and typically either drain current or source current is selected as the synapse output. Subthreshold operation is chosen for three reasons. First, because the power consumption of a subthreshold MOSFET is typically less than 1 μW, these learning systems will operate at low power. Second, because the channel current in a subthreshold MOSFET is an exponential function of the gate voltage, only small quantities of oxide charge are required for learning. Third, the channel current in a subthreshold floating-gate MOSFET is the product of the stored memory value and the applied input:

$$I_g = I_o e^{\frac{\kappa Q_{fg}}{C_T U_t}} e^{\frac{\kappa C_{in} V_{in}}{C_T U_t}} = I_o e^{\frac{\kappa Q_{fg}}{Q_t}} e^{\frac{\kappa' V_{in}}{U_t}} \quad (EQ. 1)$$

$$= I_m e^{\frac{\kappa' V_{in}}{U_t}} \quad (EQ. 2)$$

where $I_s$ is the source current, $I_o$ is the preexponential current, ic, is the floating-gate to channel-surface coupling coefficient, $Q_{fg}$ is the floating-gate charge, $C_T$ is the total capacitance seen by the floating gate, $U_t$ is the thermal voltage κT/q, $C_{in}$ is the input (poly-1 to poly-2) coupling capacitance, $V_{in}$ is the signal voltage applied to the poly-2 input, $Q_T \equiv C_T U_t$, and $\kappa' \equiv \kappa C_{in}/C_T$.

The quantity $I_m$ is the stored memory; its value changes with synapse use. The synapse output is the product of $I_m$ and the exponentiated gate input. Because the tunneling and injection gate currents vary with the synapse terminal voltages and channel current, $I_m$ varies with the terminal voltages, which are imposed on the device, and with the channel current, which is the synapse output. Consequently, the synapses exhibit a type of learning by which their future output depends on both the applied input and the present output.

The nFET Synapse

Figure 6A:
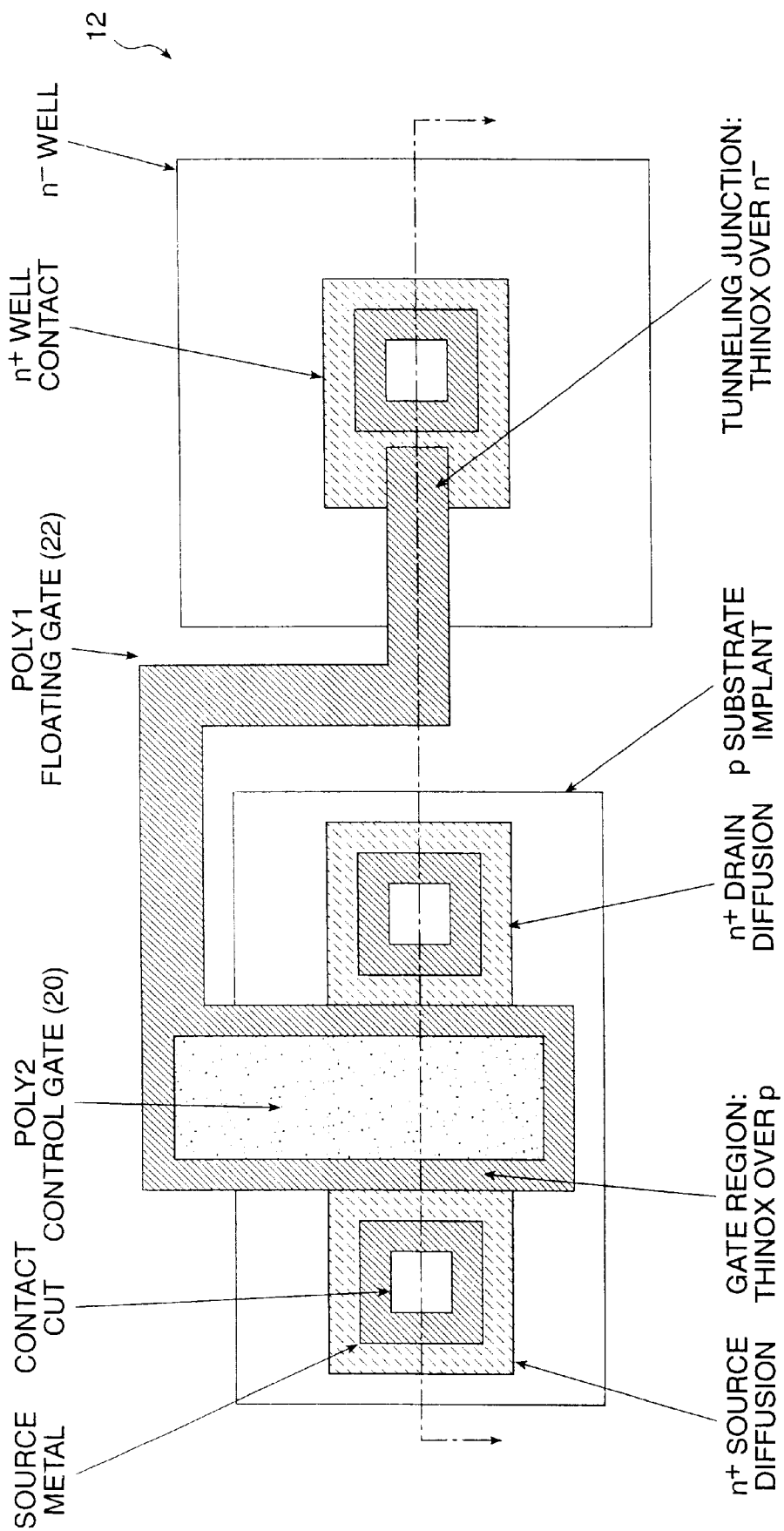
FIGS. 6A, 6B and 6C depict an nFET synapse, showing the electron tunneling and injection locations. The three figures are aligned vertically.
Figure 6B:
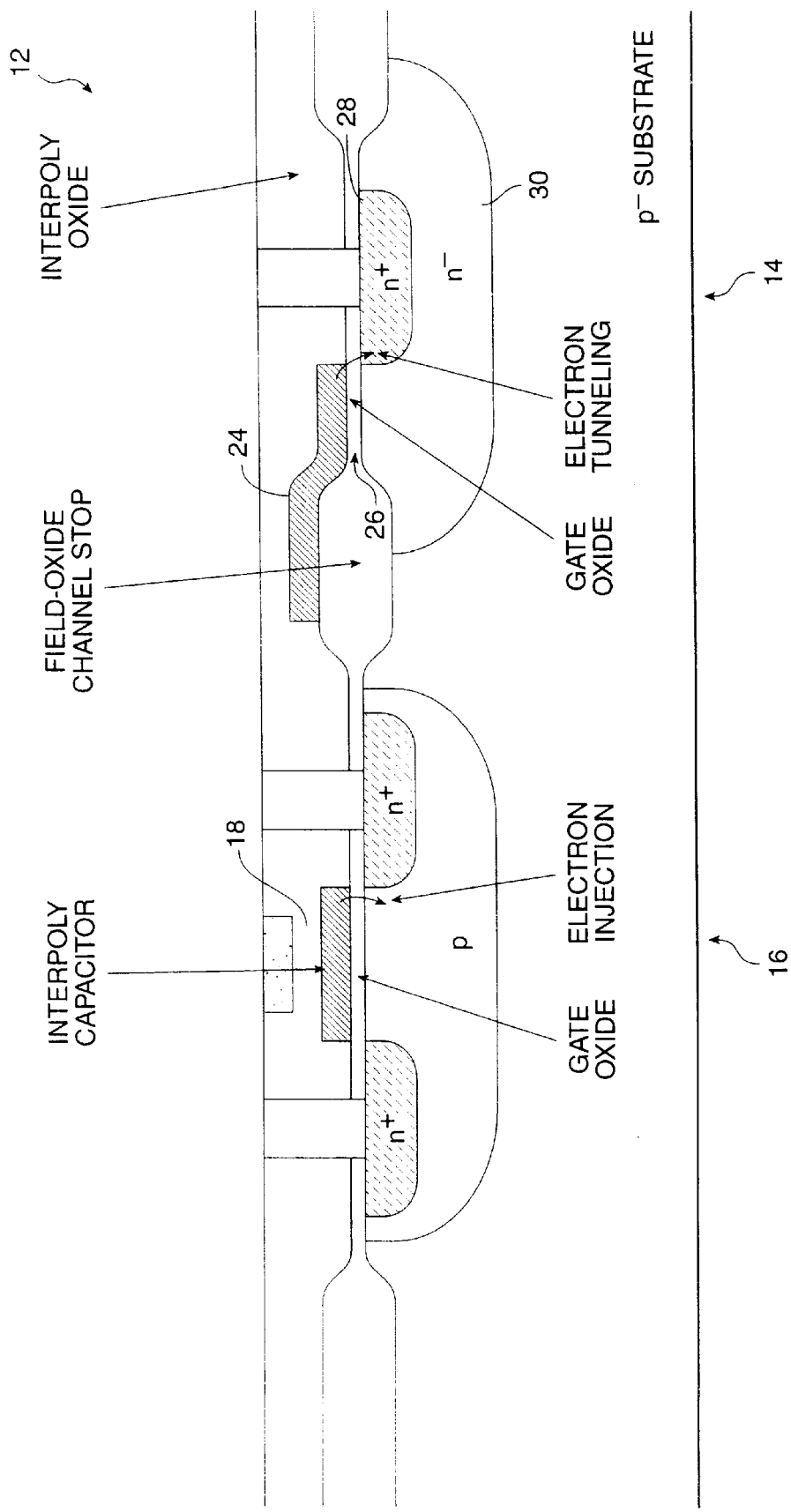
Figure 6C:
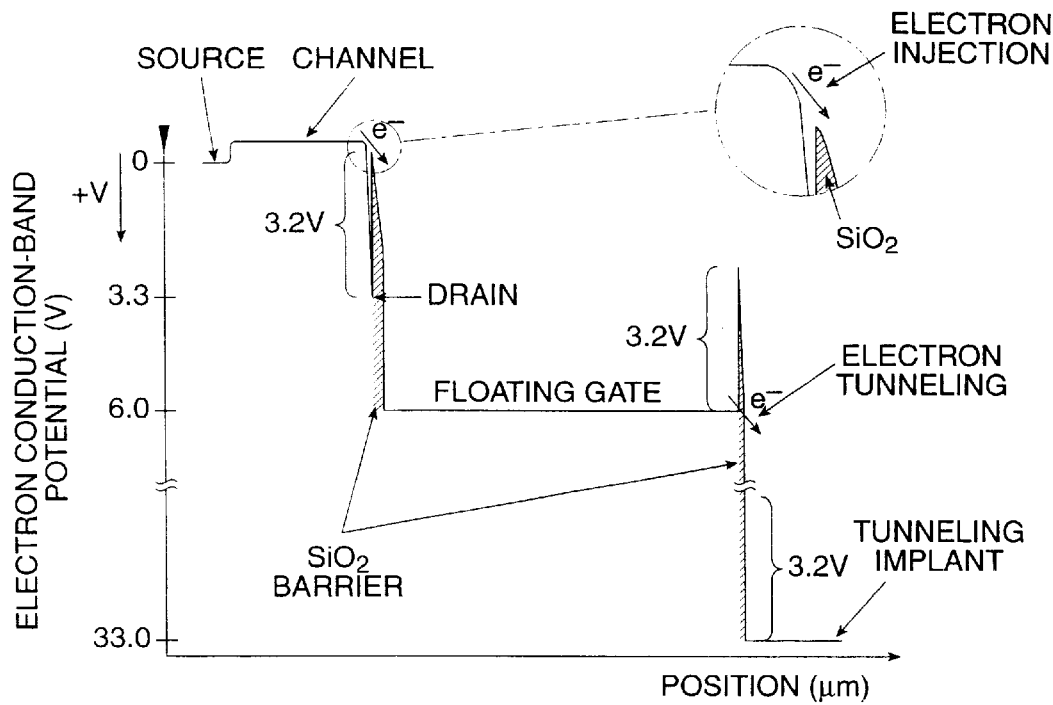

FIGS. 6A, 6B and 6C depict an nFET synapse 12, showing the electron tunneling 14 and injection 16 locations. The three figures are aligned vertically. FIGS. 6A (top view) and 6C (band diagram) are drawn to scale; the vertical scale in FIG. 6B (side view) has been exaggerated for clarity. All voltages in the conduction-band diagram are referenced to the source potential, and subthreshold ($I_s$<100 nA) operation is assumed. Although in the band diagram FIG. 6C, the gate oxide actually projects into the plane of the page, for convenience it has been rotated 90° and drawn in the channel direction. The principal features of the nFET synapse are the following:

(1) Electrons tunnel from the floating gate 24, through the 350 Å gate oxide 26, to the tunneling implant 28. A relatively high positive voltage applied to the tunneling implant 28 provides the oxide E-field required for tunneling. To prevent reverse-bias pn-junction breakdown at the tunneling implant 28, the tunneling implant 28 is disposed in a lightly doped n⁻ well 30. Because tunneling removes electrons from the floating gate, from the control gate's (20) perspective tunneling reduces the transistor's threshold voltage $V_t$.

(2) Electron tunneling is enhanced where the poly-1 floating gate 22 overlaps the heavily doped n⁺ well contact 28, for two reasons. First, the gate cannot deplete the n⁺ well contact 28, whereas it does deplete the n⁻ well 30. Thus, the oxide E-field is higher over the n⁺ well contact 28. Second, enhancement at the gate edge further augments the oxide field.

(3) Electrons inject from the channel-to-drain space-charge layer to the floating gate. To facilitate injection, a p-type bipolar-transistor base implant is applied to the nFET MOS transistor channel. As a result, the channel-to-drain depletion region approximates a one-sided step-junction, increasing the injection likelihood. The channel implant also raises the transistor threshold voltage $V_t$, favoring the collection of the injected electrons by the floating gate. Because injection adds electrons to the floating gate, from the control gate's perspective injection increases the transistor's threshold voltage $V_t$.

(4) Oxide uniformity and purity determine the initial matching between synapses, as well as the learning-rate degradations due to oxide trapping. Thermally grown gate oxide is therefore used for all $SiO_2$ carrier transport due to its superior uniformity and purity.

The pFET Synapse

Figure 7C:
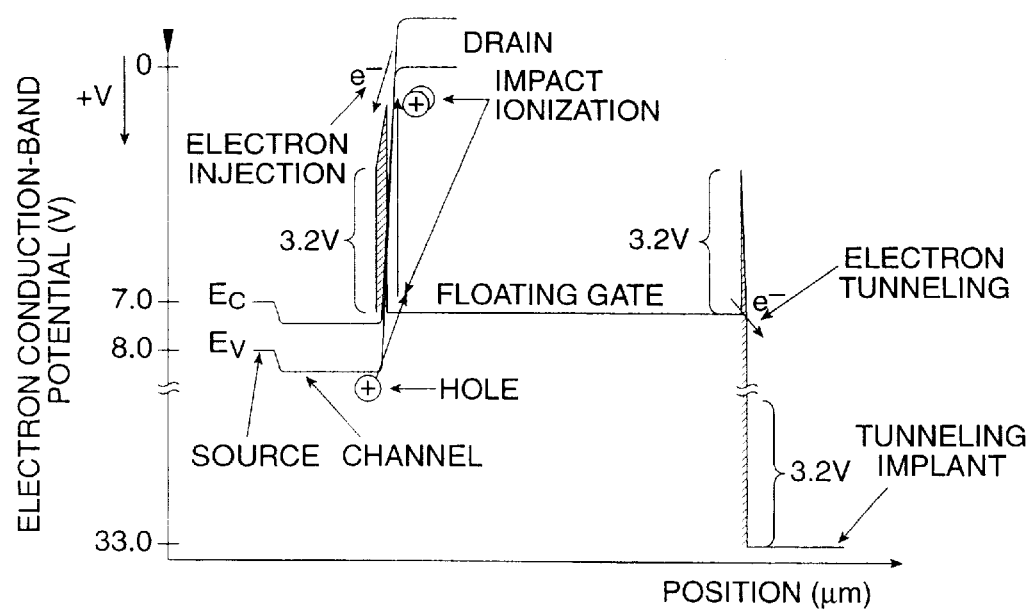
FIGS. 7A, 7B and 7C show a pFET synapse, showing the electron tunneling and injection locations. The well contact is not shown. Like in FIGS. 6A, 6B and 6C, the three figures are aligned vertically.
Figure 7A:
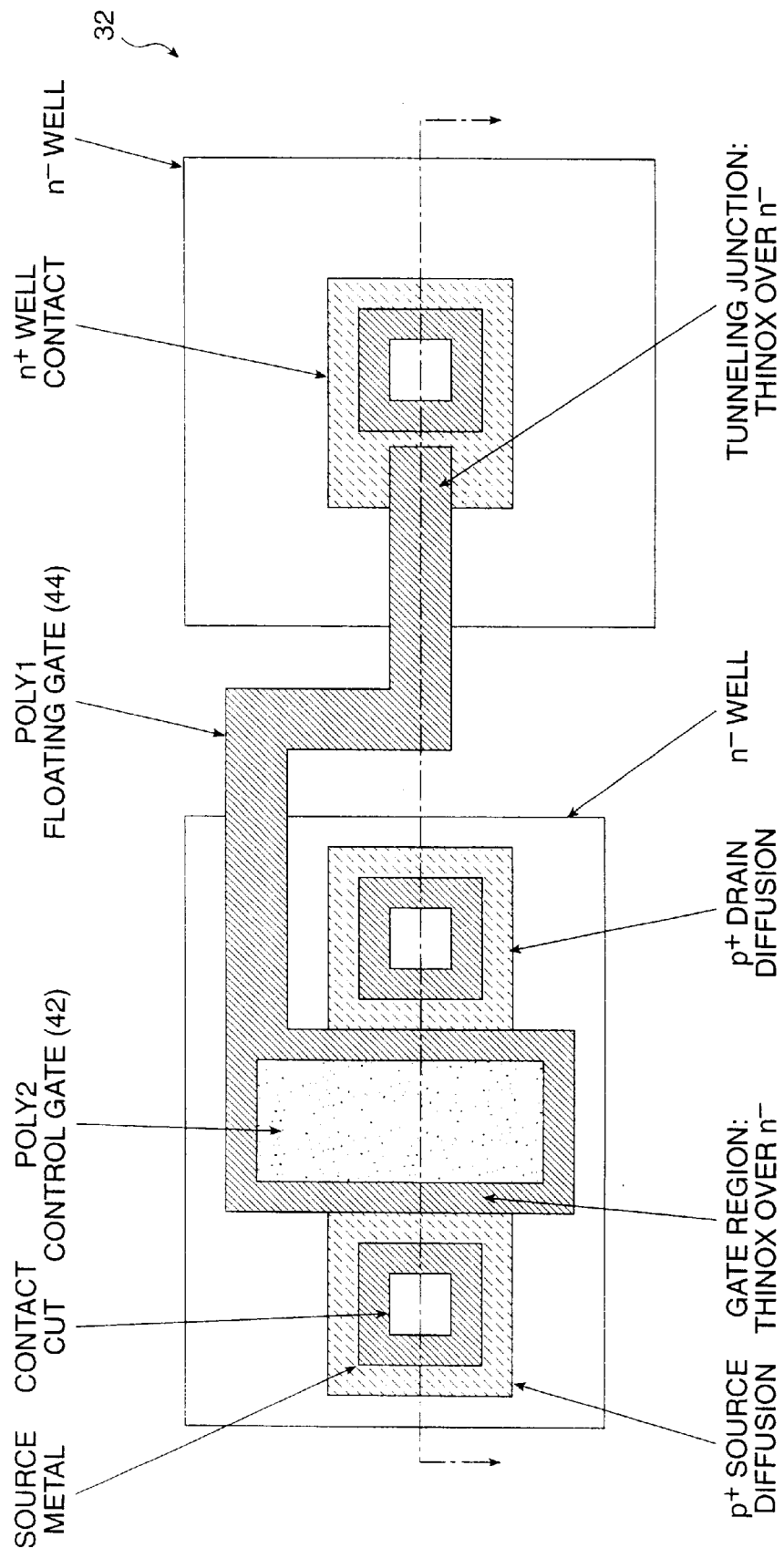
Figure 7B:
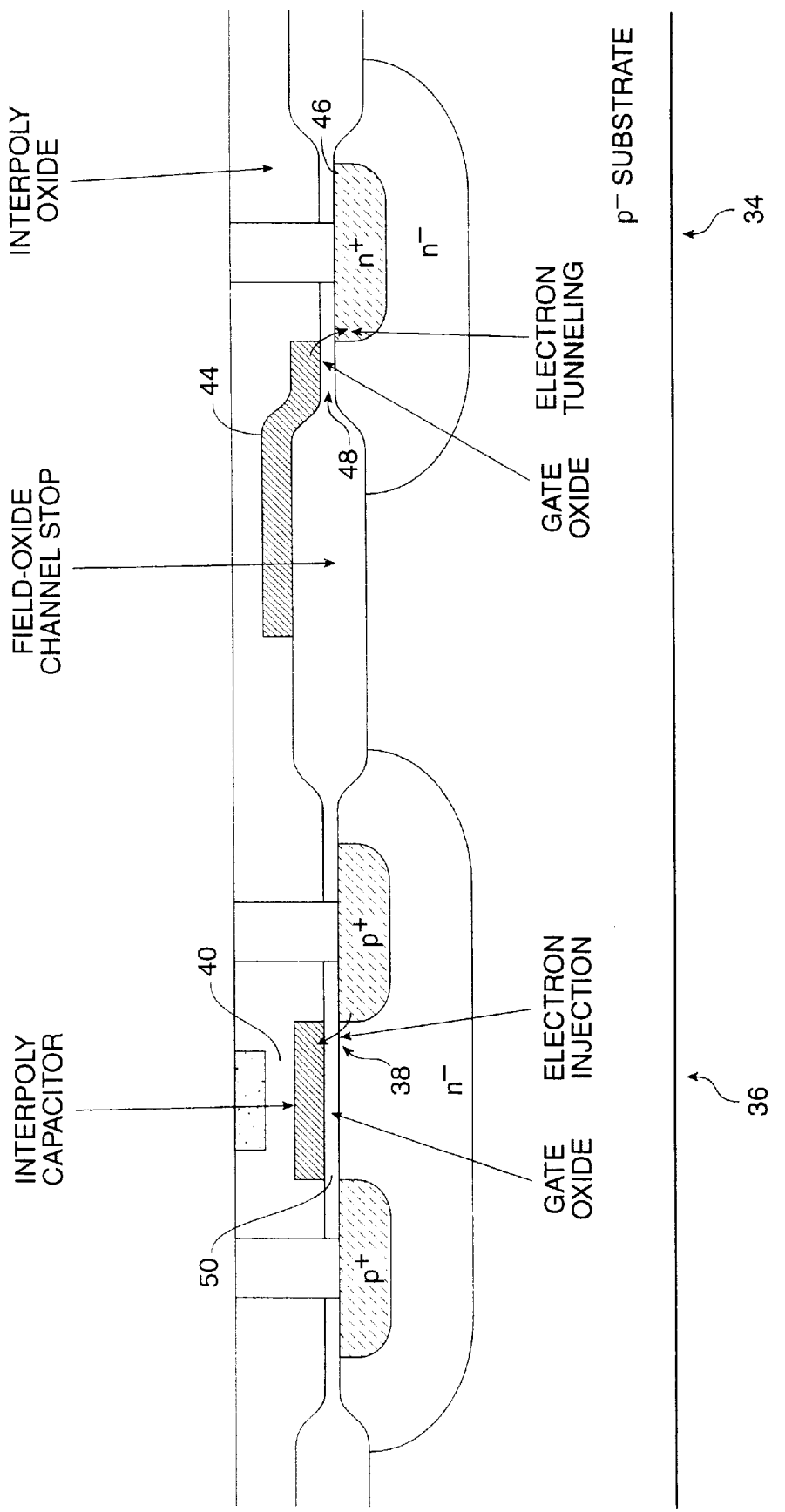

FIGS. 7A, 7B and 7C show a pFET synapse 32 according to the invention, showing the electron tunneling 34 and injection 36 locations. The well contact is not shown. Like in FIGS. 6A, 6B and 6C, the three figures are aligned vertically, FIGS. 7A (top view) and 7C (band diagram) are drawn to scale, the vertical scale in FIG. 7B (side view) has been exaggerated, the voltages in the conduction-band diagram (FIG. 7C) are referenced to the source potential, and subthreshold ($I_s$<100 nA) operation is assumed. Whereas the tunneling process is identical to the nFET synapse at FIGS. 6A–6C, the injection process is quite different. Because the charge carriers are holes, electrons are generated by means of hole impact ionization at the drain 38.

The principal features of the pFET synapse are the following:

(1) Electrons tunnel from the floating gate 44 to the n⁺ tunneling implant 46 through 350 Å gate oxide 48. The tunneling implant 46 is identical to that used in the nFET synapse of FIGS. 6A–6C. As in the nFET synapse, tunneling removes electrons from the floating gate 44. However, because the pFET and nFET synapses are complementary, from the control gate's perspective tunneling has the opposite effect on the pFET synapse—it increases, rather than decreases, the transistor's threshold voltage $V_t$.

(2) Hole impact ionization, at the channel-drain junction 38, generates the electrons for oxide injection. Channel holes, accelerated in the channel-to-drain E-field, collide with the semiconductor lattice to produce additional electron-hole pairs. The liberated electrons, promoted to their conduction band by the collision, are expelled rapidly from the drain region by this same channel-to-drain E-field.

(3) Impact-generated electrons that acquire more than 3.2 eV of kinetic energy can, if scattered upward into the gate oxide 50, inject from the channel-to-drain space-charge layer onto the floating gate 44. As in the nFET synapse, injection adds electrons to the floating gate 44; because the device is a pFET, however, from the control gate's perspective injection reduces the transistor's threshold voltage $V_t$.

(4) Like the nFET synapse, the pFET synapse uses the gate oxide for all $SiO_2$ carrier transport.

The Gate Current Equation

These silicon synapses are intended initially for use in building silicon learning systems. Because the learning behavior of any such system is determined in part by the tunneling and injection processes that alter the stored memory, these processes are now described over the subthreshold operating range.

The Tunneling Process

The tunneling process, for the nFET and pFET synapses, is shown in the energy-band diagrams (see, e.g., A. S. Grove, *Physics and Technology of Semiconductor Devices*, New York: John Wiley & Sons, Inc., 1967) of FIG. 6C and FIG. 7C, respectively. In the Fowler-Nordheim tunneling process, the potential difference between the tunneling implant and the floating gate reduces the effective oxide thickness, facilitating electron tunneling from the floating gate, through the $SiO_2$ barrier, into the oxide conduction band. These electrons are then swept by the oxide E-field over to the tunneling implant. Positive high voltages are applied to the tunneling implant to promote electron tunneling.

The Tunneling Equation

Figure 8:
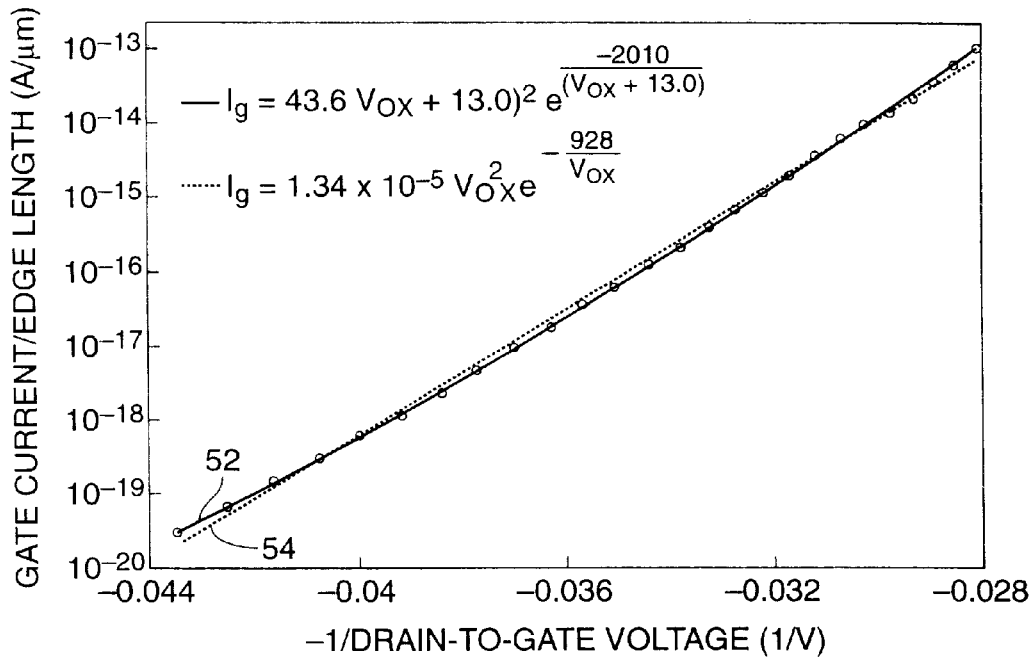
FIG. 8 is a plot of tunneling gate current versus oxide voltage, normalized to the tunneling-junction edge length in lineal microns. $V_{OX}$ is defined as the potential difference between the tunneling junction and the floating gate. The modified Fowler-Nordheim fit (solid line) employs a built-in voltage to account for oxide traps; the conventional Fowler-Nordheim fit (dashed line) is shown for comparison.

FIG. 8 is a plot of tunneling gate current versus oxide voltage, normalized to the tunneling-junction edge length in lineal microns. $V_{ox}$ is defined as the potential difference between the tunneling junction and the floating gate. The modified Fowler-Nordheim fit (solid line) 52 employs a built-in voltage to account for oxide traps; the conventional Fowler-Nordheim fit (dashed line) 54 is shown for comparison.

The data of FIG. 8 show the tunneling gate current versus the oxide voltage, where oxide voltage is defined to be the potential difference between the tunneling implant and the floating gate. These data are then fit with a modified Fowler-Nordheim fit, which employs a built-in potential, $V_{bi}$, to account for oxide traps:

$$I_g = \xi(V_{ox} + V_{bi})^2 e^{-\frac{V_o}{V_{ox}+V_{bi}}} \qquad (EQ.\,3)$$

where $I_g$ is the gate current, $V_{ox}$ is the oxide voltage, and $\xi$, $V_{bi}$, and $V_o$ are constants. For comparison, the conventional Fowler-Nordheim fit from M. Lenzlinger and E. H. Snow, "*Fowler-Nordheim tunneling into thermally grown $SiO_2$,*", *J. Of Appl. Phys.*, vol. 40, no. 6, pp. 278–283, 1969, and S. M. Sze, *Physics of Semiconductor Devices*, New York: John Wiley & Sons, Inc., 1981 also is shown:

$$I_g = \varphi V_{ox}^2 e^{-\frac{V_f}{V_{ox}}} \qquad (EQ.\,4)$$

where $V_f$=928V is consistent with a recent survey of $SiO_2$ tunneling (C. Mead, "*Scaling of MOS technology to submicrometer feature sizes,*" *J. Of VLSI Signal Processing*, vol. 8, pp. 9–25, 1994) given the synapse transistor's 350 Å gate oxide, and $\phi$ is a fit parameter.

The data of FIG. 8 are normalized to the gate-to-$n^+$ edge length, in lineal microns. The reason is that the floating gate induces a depletion region in the lightly doped $n^-$ tunneling implant, reducing the effective oxide voltage, and therefore also the tunneling current. Because the gate cannot appreciably deplete the $n^+$ drain contact, the oxide field is higher where the self-aligned floating gate overlaps the $n^+$. Because the tunneling current is exponential in the oxide voltage, tunneling in the synapse transistors is primarily an edge phenomenon.

The Hot-Electron Injection Process

The hot-electron injection process (see, e.g., J. J. Sanchez and T. A. DeMassa, "*Review of carrier injection in the silicon/silicon-dioxide system,*" *IEE Proceedings-G*, vol. 138, no. 3, pp. 377–389, 1991) for both the nFET and pFET synapses, is shown in the energy-band diagrams of FIG. 6C and FIG. 7C, respectively. Electrons inject from the transistor channel, over the 3.2V $Si$—$SiO_2$ work-function barrier, into the oxide conduction band. These electrons then are swept by the oxide E-field over to the floating gate. Successful injection, for both the nFET and pFET synapses, requires that the following three conditions be satisfied: (1) the electrons must possess the 3.2 eV required to surmount the $Si$—$SiO_2$ barrier, (2) the electrons must scatter upward into the gate oxide, and (3) the oxide E-field must be in the proper direction to transport the electrons to the floating gate.

nFET Injection

In a conventional n-type MOSFET, requirements (1) and (2) are readily satisfied. Simply operate the transistor in its subthreshold regime, with a drain-to-source voltage greater than about 3V. Because the subthreshold channel-conduction band is flat, the channel-to-drain transition is steep, implying a large electric field. Channel electrons are accelerated rapidly in this field; a fraction of them acquire the 3.2 eV required for hot-electron injection. A fraction of these 3.2 eV electrons naturally scatter, by means of collisions with the semiconductor lattice, upward into the gate oxide.

It is principally requirement (3) that prevents injection in a conventional nFET. Subthreshold operation typically implies gate voltages <0.8V. With the transistor drain at 3V, and the gate at 0.8V, the drain-to-gate electric field opposes transport of the injected electrons to the floating gate. The electrons are instead returned to the transistor drain.

Increasing the synapse transistor's bulk channel doping promotes the transport of injected electrons to the floating gate. The additional dopant increases the channel surface-acceptor concentration, raising the transistor's threshold voltage from 0.8V to 6V. With the synapse drain at 3V, and the gate at 6V, the channel current is subthreshold, but now the oxide E-field sweeps injected electrons over to the floating gate, rather than returning them to the silicon surface.

pFET Injection

Because the pFET channel current is holes, the pFET hot-electron injection process is different from that in the nFET. Channel holes in the channel-to-drain depletion region of a subthreshold pFET are accelerated. A fraction of these holes collide with the semiconductor lattice at energies sufficient to liberate additional electron-hole pairs. The ionized electrons, promoted to their conduction band by the collision, are expelled from the drain by the channel-to-drain E-field. If these ionized electrons are expelled with more than 3.2 eV of kinetic energy, they can be injected onto the floating gate.

As in the nFET synapse, in the pFET synapse injection requirements (1) and (2) are easily satisfied. Simply operate the transistor in its subthreshold regime, with a drain-to-source voltage greater than about 6V. The higher drain-voltage requirement, when compared with the nFET synapse, is a consequence of the two-step injection process.

Because, in a subthreshold pFET, the gate-to-source voltage typically is less than 1V, if the drain-to-source voltage exceeds 6V, the gate voltage must exceed the drain voltage by at least 5V. The oxide E-field supports strongly the transport of injected electrons to the floating gate, and requirement (3) is always satisfied. Unlike conventional nFET transistors, conventional pFET transistors naturally inject electrons onto their floating gates (at sufficient drain-to-source voltages); no special channel implant is required to facilitate injection.

The Injection Equation

Figure 9:
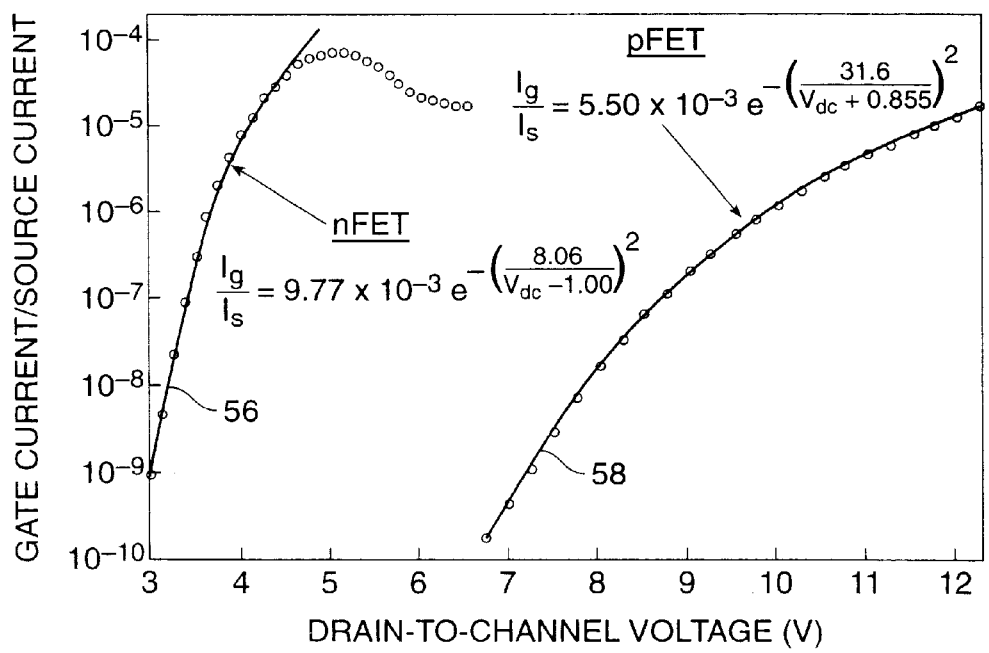
FIG. 9 is a plot of injection efficiency versus drain-to-channel voltage, for both the nFET (left) and pFET (right) synapses. The gate-to-channel voltages were held fixed during the experiments. For the nFET, $V_{gc}$=5.66V; for the pFET, $V_{gc}$=1.95V. In the nFET synapse, when the drain voltage exceeds the floating-gate voltage, the oxide E-field tends to return the injected electrons to the silicon surface, rather than transporting them to the floating gate. As a result, for drain-to-channel voltages near $V_{gc}$=5.66V, the nFET data deviate from the fit.

FIG. 9 is a plot of injection efficiency (gate current divided by source current) versus drain-to-channel voltage, for both the nFET (left) 56 and pFET (right) 58 synapses. The gate-to-channel voltages were held fixed during the experiments. For the nFET, $V_{gc}$=5.66V; for the pFET, $V_{gc}$=1.95V. In the nFET synapse, when the drain voltage exceeds the floating-gate voltage, the oxide E-field tends to return the injected electrons to the silicon surface, rather than transporting them to the floating gate. As a result, for drain-to-channel voltages near $V_{gc}$=5.66V, the nFET data deviate from the fit.

The data are plotted as efficiency because, for both devices, the gate current is linearly proportional to the source current over the entire subthreshold range. Because the hot-electron injection probability varies with channel potential, all terminal voltages are referenced to the channel. The results can be re-referenced to the source terminal using the relationship between source and channel potential in a subthreshold MOS transistor (see, C. C. Enz, F. Krummenacher, and E. A. Vittoz, "*An analytical MOS transistor model valid in all regions of operation and dedicated to low-voltage and low-current applications,*" *Analog Integrated Circuits and Signal Processing*, vol. 8, pp. 83–114, 1995, and A. G. Andreou and K. A. Boahen, "*Neural information processing II,*" in M. Ismail and T. Fiez, eds., *Analog VLSI Signal and Information Processing*, New York: McGraw-Hill, Inc., pp 358–413, 1994):

$$\psi \sim \kappa V_{gb} + \psi_o \qquad (EQ. 5)$$

where $\psi$ is the channel-surface potential, $V_{gb}$ is the gate-to-bulk voltage, $\kappa$ is the gate-to-surface coupling coefficient, and $\psi_o$ is derived from the MOS process parameters.

For both devices the injection efficiency is independent to first-order, of the gate-to-channel voltage, as long as $V_{gb>Vdb}$ (where $V_{gb}$ and $V_{db}$ are the gate-to-bulk and drain-to-bulk voltages, respectively). In the pFET synapse, this condition is always satisfied. In the nFET synapse, this condition is not necessarily satisfied; the data of FIG. 9 show what happens when one sweeps the nFET synapse drain from voltages much less than $V_{gb}$, to voltages much greater than $V_{gb}$. As $V_{db}$ approaches, $V_{gb}$, the oxide voltage becomes small, and the gate current drops.

The injection data of FIG. 9 is fit empirically. For the nFET synapse, the region where $V_{db}$>$V_{gb}$ is not fit because, at such high drain voltages, the gate currents are too large for use in a practical learning system. For both synapses, then, $$I_g = \eta I_s e^{-\left(\frac{V_\beta}{V_{dc}+V_\eta}\right)^2} \qquad (EQ. 6)$$

where $V_{dc}$ is the drain-to-channel potential and $\eta$, $V_\beta$, and $V_\eta$ are measurable device parameters.

The Gate-Current Equation

Because the tunneling and injection gate currents are in opposite directions, the final gate-current equation is obtained for both synapses by subtracting EQ. 6 from EQ. 3:

$$I_g = \xi(V_{ox} + V_{bi})^2 e^{-\frac{V_O}{V_{ox}+V_{bi}}} - \eta I_s e^{-\left(\frac{V_\beta}{V_{dc}+V_\eta}\right)^2} \qquad (EQ. 7)$$

The principal difference between the nFET and pFET synapses is the sign of the learning. In the nFET synapse, tunneling increases the channel current, whereas injection decreases it; in the pFET synapse, tunneling decreases the channel current, whereas injection increases it.

Impact Ionization

Figure 10:
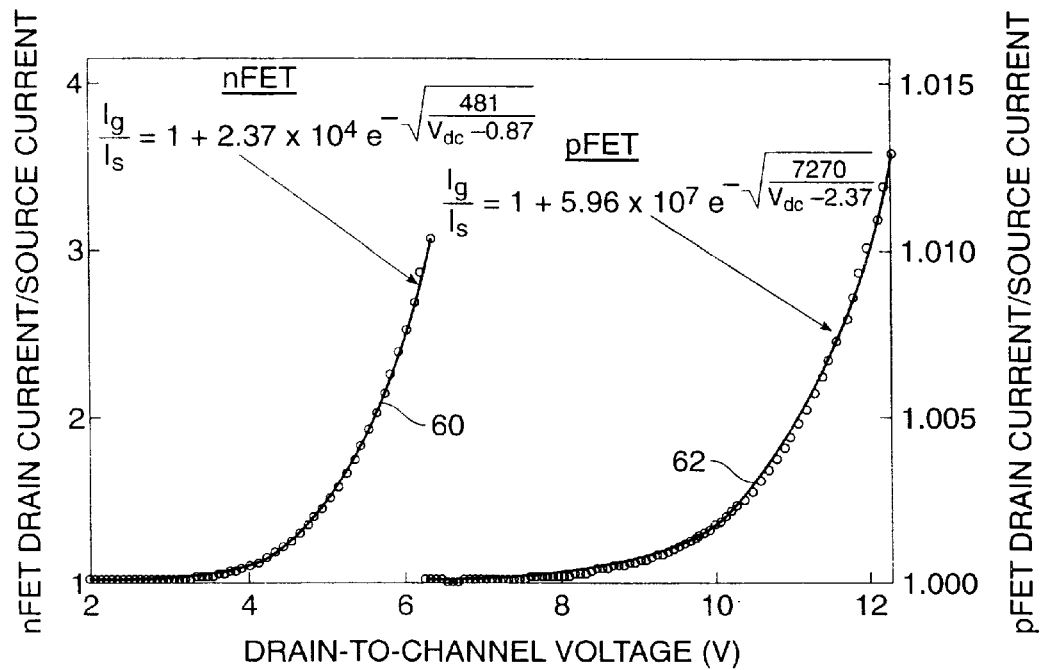
FIG. 10 is a plot of impact ionization versus drain-to-channel potential for both the nFET (left) and pFET (right) synapses. Impact ionization in the nFET is markedly more efficient than in the pFET, for two reasons. First, as a consequence of its bulk p-type substrate implant, the nFET synapse experiences a higher drain-to-channel electric field than does the pFET, thereby increasing the ionization likelihood. Second, the impact-ionization process is naturally more efficient for electrons (the nFET charge carriers) than it is for holes (the pFET charge carriers).

A synapse's weight value is equated with its source current. However, because for both synapses the activation energy for impact-ionization is less than the barrier energy for injection, a channel-to-drain E-field that generates injection electrons must also liberate additional electron-hole pairs (see, W. Shockley, "*Problems related to p-n junctions in silicon,*" *Solid-State Electronics*, vol. 2, no. 1, pp. 35–67, Pergamon Press, 1961). For both synapses, the drain current can therefore exceed the source current. If drain current, rather than source current, is chosen as the synapse output, reexpress the gate-current equation in terms of drain current using the following relation adapted from S. Tam, P. Ko, and C. Hu, "*Lucky-electron model of channel hot-electron injection in MOSFET's,*" *IEEE Trans. Electron Devices*, vol. ED-31, no. 9, pp. 1116–1125, 1984:

$$I_d = I_s\left(1 + \varepsilon e^{-\sqrt{\frac{V_m}{V_{ds}-V_\varepsilon}}}\right) \qquad (EQ. 8)$$

where $I_d$ is the drain current and $\epsilon$, $V_m$, and $V_\epsilon$ are measurable device parameters. FIG. 10 is a plot of impact ionization versus drain-to-channel potential for both the nFET (left) 60 and pFET (right) 62 synapses. Impact ionization in the nFET is markedly more efficient than in the pFET, for two reasons. First, as a consequence of its bulk p– type substrate implant, the nFET synapse experiences a higher drain-to-channel electric field than does the pFET, thereby increasing the ionization likelihood. Second, the impact-ionization process is naturally more efficient for electrons (the nFET charge carriers) than it is for holes (the pFET charge carriers).

Thus in a floating gate transistor, the injection current of hot electrons across the insulator and onto the floating gate from the drain-channel depletion region is linear with changes in the channel current and exponential with changes in the drain-to-source voltage within a certain range. Within this range the threshold voltage of the transistor is continuously (and controllably) adjustable. When the range is exceeded (i.e., drain is more negative than source by a sufficient magnitude) this controllable behavior is replaced by uncontrollable avalanche breakdown of the junction. Devices which can now be fabricated making use of this feature include the pFET semiconductor structure for long term learning discussed in detail herein, autozeroing amplifiers, analog EEPROM memories, multi-bit memories and myriad other related structures known to those of ordinary skill in the art which require or can utilize the writing of a precisely controlled amount of charge onto a floating gate.

Synaptic Arrays

A synaptic array, with a synapse transistor at each node, can form the basis of a silicon learning system. Simplified 2×2 arrays have been fabricated to investigate synapse isolation during tunneling and injection, and to measure the synapse learning rates. Because a 2×2 array uses the same row-column addressing employed by larger arrays, it allows one to characterize completely the synapse isolation and learning.

The nFET Array

Figure 11:
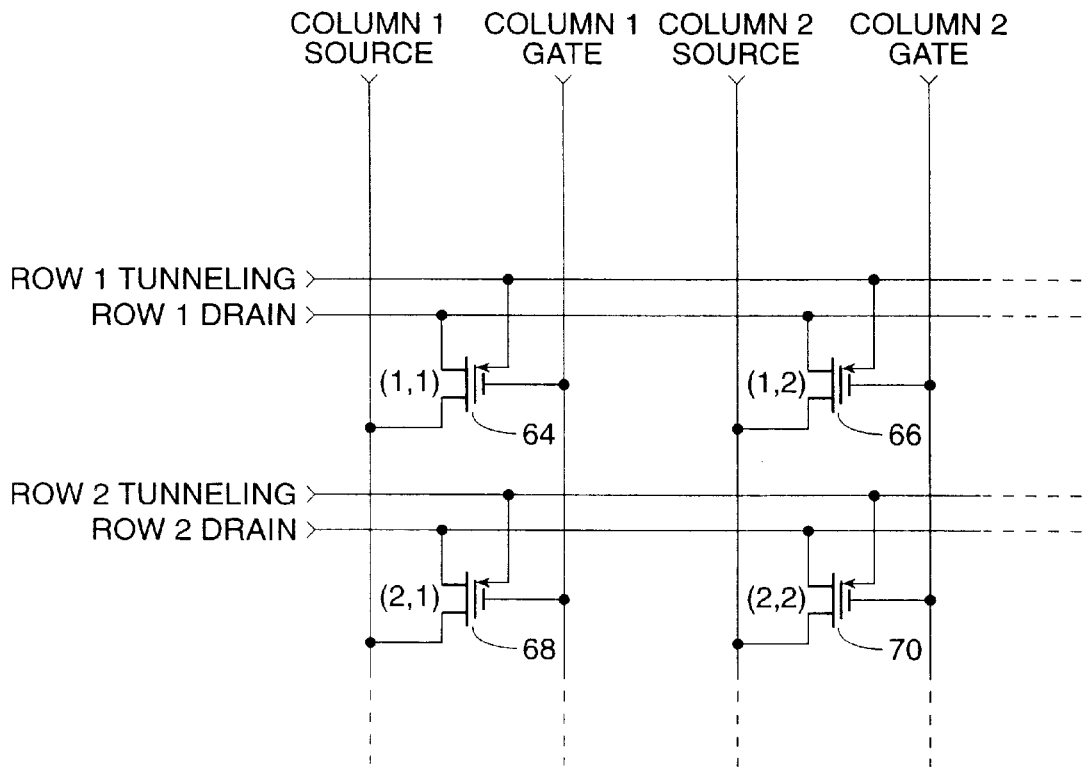
FIG. 11 is a schematic diagram showing a 2×2 array of nFET synapses. Because the row synapses share common tunneling and drain wires, tunneling or injection at one row synapse can cause undesired tunneling or injection at other row synapses.

The nFET array is shown in FIG. 11. Here, from among the many possible ways of using the array, source current is selected as the synapse output, and the synapses are turned off while tunneling. The voltages shown in Table 1 were applied to read, tunnel, or inject synapse {1,1} 64 selectively, while ideally leaving the other synapses 66, 68 and 70 unchanged to obtain the data of FIGS. 12 and 13.

TABLE 1

|        | Col.1 gate | Col.1 source | Col.2 gate | Col.2 source | Row 1 drain | Row 1 tun | Row 2 drain | Row 2 tun |
|--------|------------|--------------|------------|--------------|-------------|-----------|-------------|-----------|
| Read   | +5         | 0            | 0          | 0            | +1          | 0         | 0           | 0         |
| Tunnel | 0          | 0            | +5         | 0            | 0           | +31       | 0           | 0         |
| Inject | +5         | 0            | 0          | 0            | 3.15        | 0         | 0           | 0         |

Because the row synapses share common tunneling and drain wires, tunneling or injection at one row synapse can cause undesired tunneling or injection at other row synapses. Because the synapse drain and tunneling terminals are connected within a row, but not within a column, the crosstalk between column synapses is negligible. Because the tunneling and injection processes are exponential in the oxide voltage, the row-synapse crosstalk can be made small by ensuring a sufficient oxide-voltage difference between the selected and deselected synapses. With 5V control-gate inputs, a 4V difference in synapse oxide voltage is achieved; the resulting crosstalk between row synapses is <0.01% for all operations.

Figure 12:
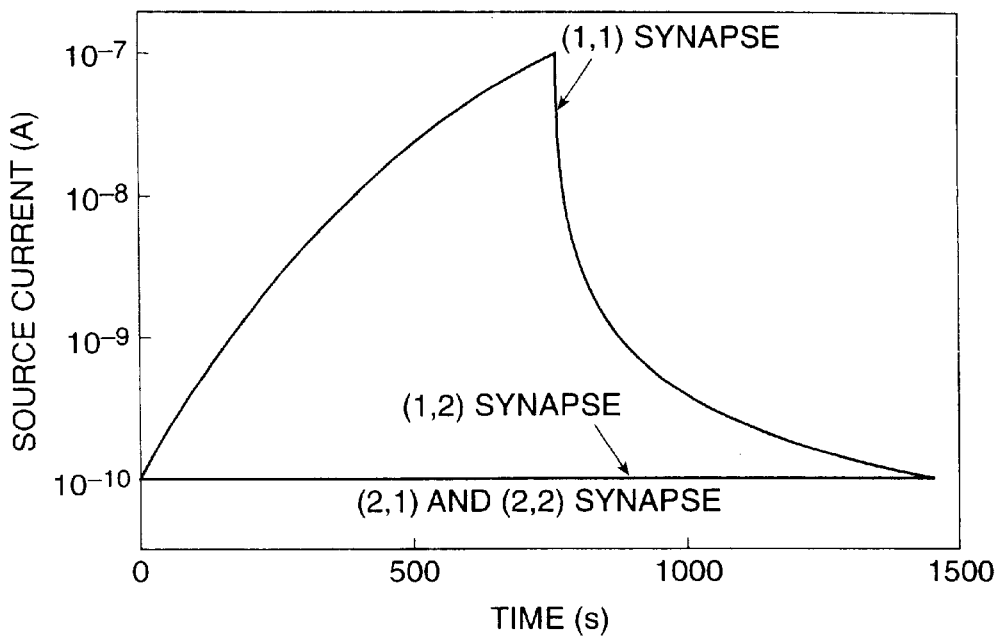
FIG. 12 is a plot of isolation in a 2×2 array of nFET synapses. Source current is the synapse output. The {1,1} synapse first is tunneled up to 100 nA, then is injected back down to 100 pA. The tunneling voltage, referenced to the substrate potential, is $V_{tun}$=31V; the injection voltage is $V_{ds}$=3.15V. Crosstalk to the {1,2} synapse, defined as the fractional change in the {1,2} synapse divided by the fractional change in the {1,1} synapse, is 0.006% when tunneling, and is 0.002% when injecting.
Figure 13:
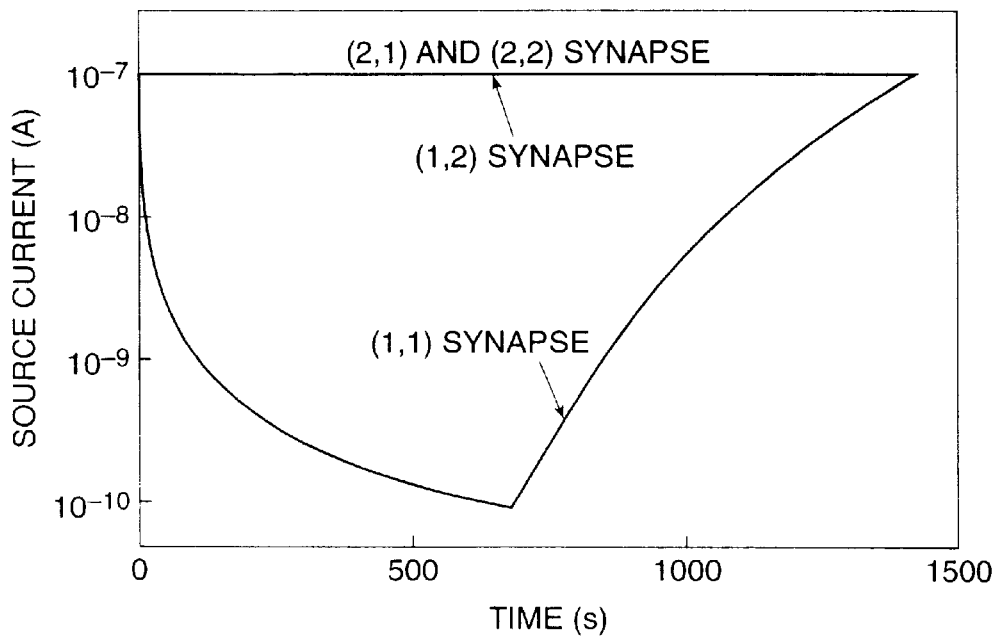
FIG. 13 is a plot similar to that of FIG. 12, but here the {1,1} synapse first is injected down to 100 pA, then is tunneled back up to 100 nA. Crosstalk to the {1,2} synapse is 0.001% when injecting, and is 0.002% when tunneling.

To obtain the data in FIG. 12, all synapses were initially set to $I_s$=100 pA. The {1,1} synapse was tunneled up to 100 nA, and then injected back down to 100 pA, while measuring the source currents of the other three synapses. Crosstalk to the {1,2} synapse is 0.001% when injecting, and is 0.002% when tunneling. The tunneling voltage, referenced to the substrate potential, is $V_{tun}$=31V; the injection voltage is $V_{ds}$=3.15V. FIG. 13 is a plot similar to that of FIG. 12, but here the {1,1} synapse 64 first is injected down to 100 pA, then is tunneled back up to 100 nA. Crosstalk to the {1,2} synapse, defined as the fractional change in the {1,2} synapse divided by the fractional change in the {1,1} synapse, is 0.006% when tunneling, and is 0.002% when injecting. As expected, the row 2 synapses were essentially unaffected by either the tunneling or the injection. Coupling to the {1,2} synapse was also small.

The pFET Array

Figure 14:
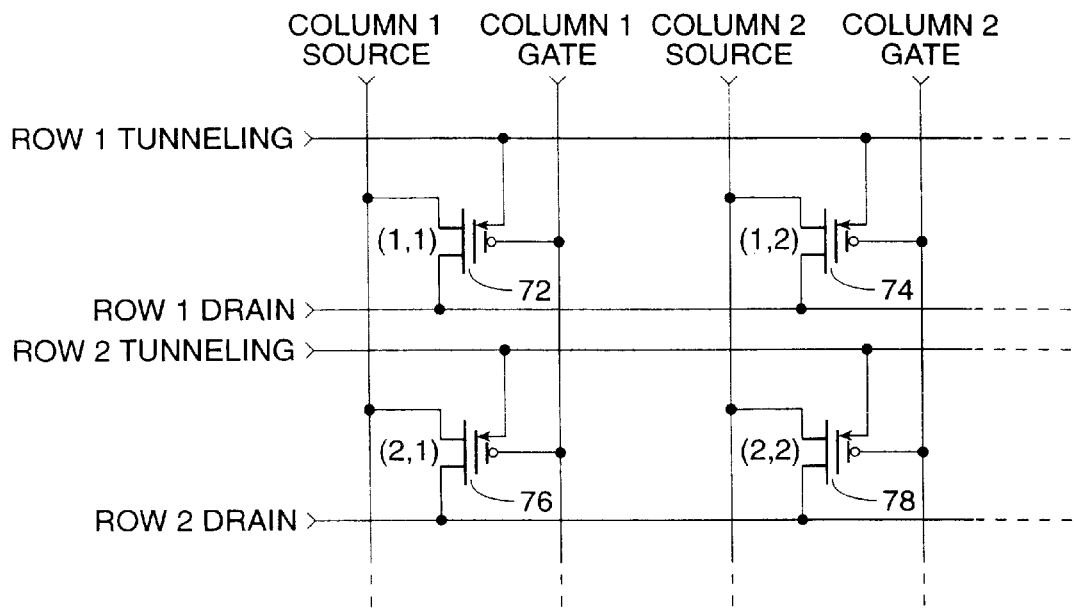
FIG. 14 is a schematic diagram showing a 2×2 array of pFET synapses. The well connections are not shown. As in the nFET array, because the row synapses share common tunneling and drain wires, tunneling or injection at one row synapse can cause undesired tunneling or injection at other row synapses.

A 2×2 pFET synapse array is shown in FIG. 14. The well connections are not shown. As in the nFET array, because the row synapses share common tunneling and drain wires, tunneling or injection at one row synapse can cause undesired tunneling or injection at other row synapses. The p-type substrate is grounded, +12V is applied to the n-type well, and all terminal voltages are referenced to the well potential. Again source current is chosen as the synapse output, but here, unlike in the nFET array, the pFET synapses are left turned on while tunneling. The voltages shown in Table 2 were applied to read, tunnel, or inject synapse {1,1} 72 selectively, while ideally leaving the other synapses unchanged, to obtain the data of FIGS. 15 and 16.

TABLE 2

|        | Col.1 gate | Col.1 source | Col.2 gate | Col.2 source | Row 1 drain | Row 1 tun | Row 2 drain | Row 2 tun |
|--------|------------|--------------|------------|--------------|-------------|-----------|-------------|-----------|
| Read   | −5         | 1            | 0          | 0            | −5          |           | 0           | 0         |
| Tunnel | −5         | 0            | 0          | 0            | −5          | +28       | 0           | 0         |
| Inject | −5         | 0            | −4         | 0            | −9.3        | 0         | 0           | 0         |

Figure 15:
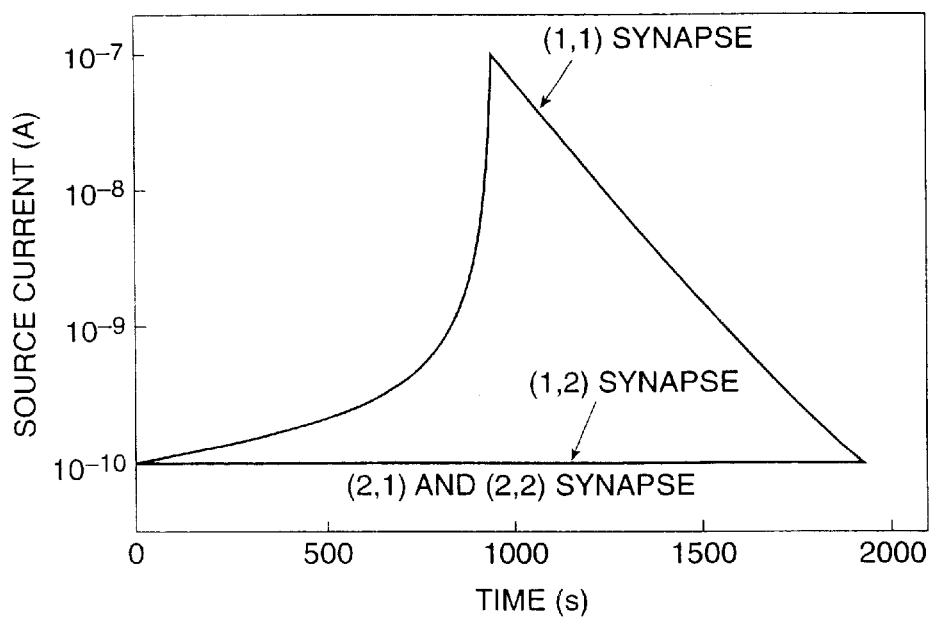
FIG. 15 is a plot of isolation in a 2×2 array of pFET synapses. Source current is the synapse output. The {1,1} synapse first is injected up to 100 nA, then is tunneled back down to 100 pA. The injection voltage is $V_{ds}$=9.3V; the tunneling voltage, referenced to the well potential, is $V_{tun}$=28V. Crosstalk to the {1,2} synapse, defined as the fractional change in the {1,2} synapse divided by the fractional change in the {1,1} synapse, is 0.016% when injecting, and is 0.007% when tunneling.

To obtain the data in FIG. 15, all synapses were initially set to $I_s$=100 pA. The {1,1} 72 synapse was then injected up to 100 nA, and then tunneled back down to 100 pA. The injection voltage is $V_{ds}$=−9.3V; the tunneling voltage, referenced to the well potential, is $V_{tun}$=28V. Crosstalk to the {1,2} synapse, defined as the fractional change in the {1,2} 74 synapse divided by the fractional change in the {1,1} 72 synapse, is 0.016% when injecting, and is 0.007% when tunneling.

Figure 16:
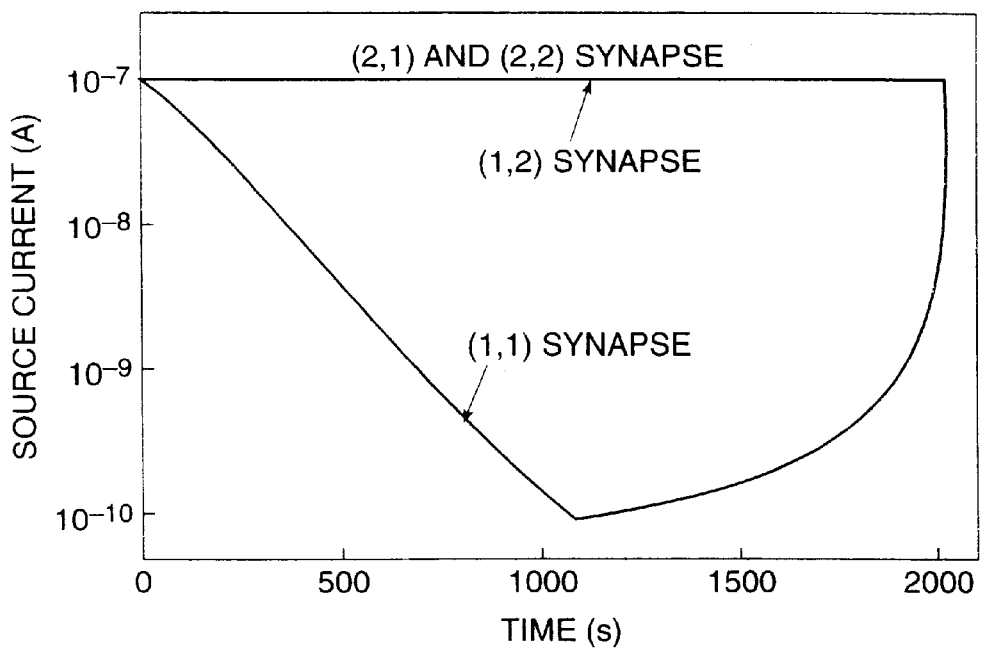
FIG. 16 is a plot similar to that of FIG. 15, but here the {1,1} synapse first is tunneled down to 100 pA, then is injected back up to 100 nA. Crosstalk to the {1,2} synapse is 0.005% when injecting, and is 0.004% when tunneling.

FIG. 16 is a plot similar to that of FIG. 15, but here the {1,1} 72 synapse first is tunneled down to 100 pA, then is injected back up to 100 nA. Crosstalk to the {1,2} 74 synapse is 0.005% when injecting, and is 0.004% when tunneling. As was the case in the nFET array, in the pFET array the crosstalk between column synapses was negligible, and the crosstalk between row synapses was small.

When the {1,1} 72 synapse is injected, −4V is applied to the {1,2} 74 synapse control gate. This is because a pFET synapse can experience hot-electron injection by a mechanism different from that described above. If the floating-gate voltage exceeds the well potential, and the drain-to-channel voltage is large, electrons can inject onto the floating gate by means of a non-destructive avalanche-breakdown phenomenon (see, e.g., E. Takeda, C. Yang, and A. Miura-Hamada, *Hot-Carrier Effects in MOS Devices,* San Diego, Calif.: Academic Press, Inc., 1995) at the MOS surface.

The Synapse Learning Rule

The experiments of FIGS. 12 and 14 were repeated for several tunneling and injection voltages; in FIGS. 17, 18, 19 and 20 are plotted for the nFET and pFET synapses the temporal derivative of the source current as a function of the source current.

Figure 17:
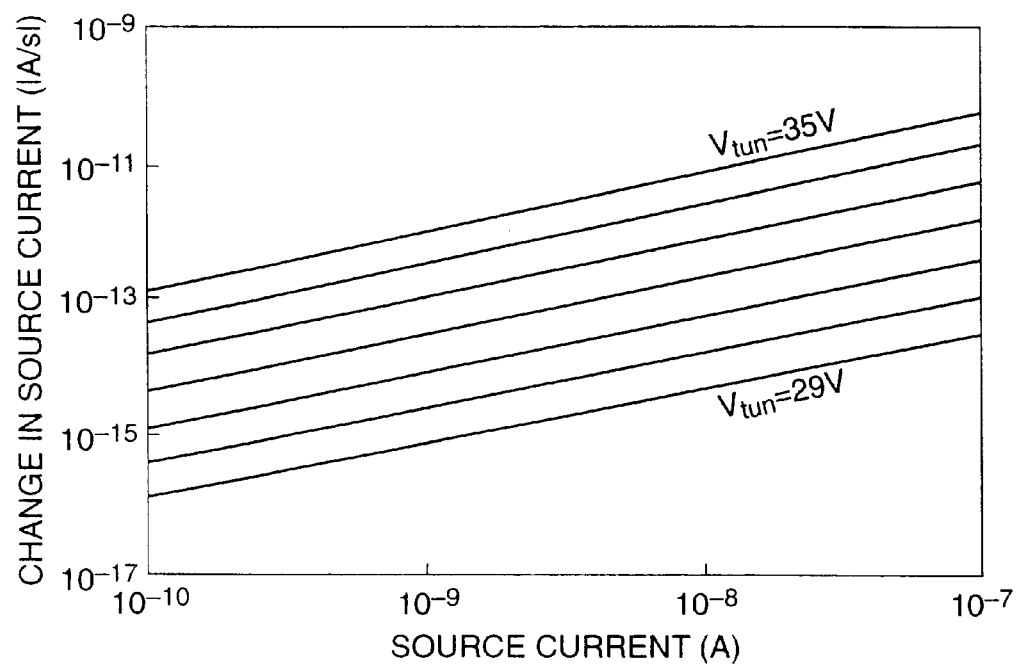
FIG. 17 is a plot of tunneling delta-weight versus weight for the nFET synapse, with source current chosen as the synapse weight. The {1,1} synapse was tunneled up as in FIG. 12, with the source at ground and the ground-referenced tunneling voltage stepped from 29V to 35V in 1V increments. This is thus a plot of the magnitude of the temporal derivative of the weight value as a function of the weight value. The mean tunneling slope is +0.83.

FIG. 17 is a plot of tunneling delta-weight versus weight for the nFET synapse, with source current chosen as the synapse weight. The {1,1} 64 synapse was tunneled up as in FIG. 12, with the source at ground and the ground-referenced tunneling voltage stepped from 29V to 35V in 1V increments. This is thus a plot of the magnitude of the temporal derivative of the weight value as a function of the weight value. The mean tunneling slope is +0.83.

Figure 18:
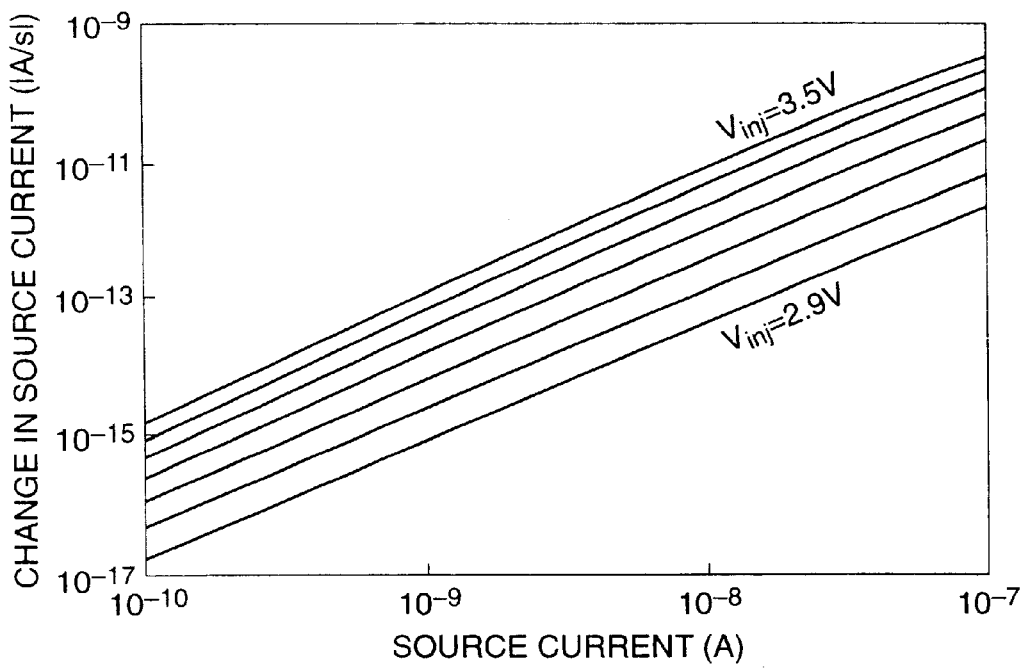
FIG. 18 is a plot of injection delta-weight versus weight for the nFET synapse, with source current chosen as the synapse weight. The {1,1} synapse was injected down as in FIG. 12, with the source at ground and the ground-referenced drain voltage stepped from 2.9V to 3.5V in 0.1V increments. The magnitude of the temporal derivative of the weight value is plotted as a function of the weight value. The mean injection slope is −1.76; the minus sign has been added because the synapse weight is injecting down.

FIG. 18 is a plot of injection delta-weight versus weight for the nFET synapse, with source current chosen as the synapse weight. The {1,1} 64 synapse was injected down as in FIG. 12, with the source at ground and the ground-referenced drain voltage stepped from 2.9V to 3.5V in 0.1V increments. The magnitude of the temporal derivative of the weight value is plotted as a function of the weight value. The mean injection slope is −1.76; the minus sign has been added because the synapse weight is injecting down.

Figure 19:
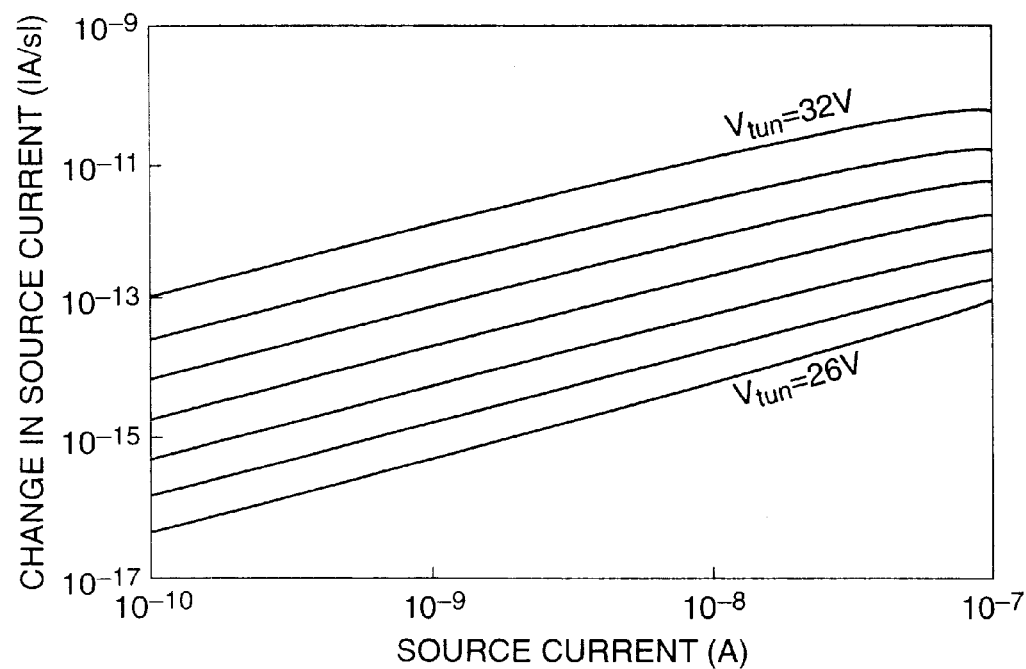
FIG. 19 is a plot of tunneling delta-weight versus weight for the pFET synapse, with source current chosen as the synapse weight. The {1,1} synapse was tunneled down as in FIG. 15, with the source and well at +12V and the tunneling voltage, referenced to the well potential, stepped from 26V to 32V in 1V increments. The magnitude of the temporal derivative of the weight values is plotted as a function of the weight value. The mean tunneling slope is −0.99; the minus sign reflects the fact that the synapse weight is tunneling down.

FIG. 19 is a tunneling delta-weight versus weight for the pFET synapse, with source current chosen as the synapse weight. The {1,1} 72 synapse was tunneled down as in FIG. 15, with the source and well at +12V and the tunneling voltage, referenced to the well potential, stepped from 26V to 32V in 1V increments. The magnitude of the temporal derivative of the weight values is plotted as a function of the weight value. The mean tunneling slope is −0.99; the minus sign reflects the fact that the synapse weight is tunneling down.

Figure 20:
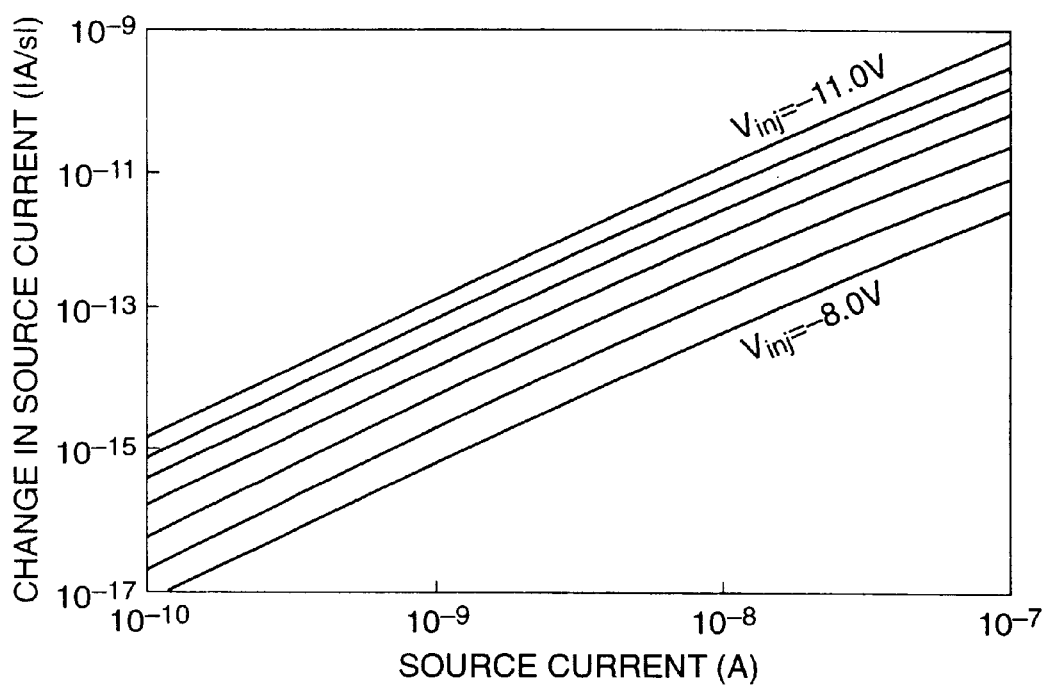
FIG. 20 is an injection delta-weight versus weight for the pFET synapse, with source current chosen as the synapse weight. The {1,1} synapse was injected up as in FIG. 15, with the source and well at +12V and the drain voltage, referenced to the source potential, stepped from −8.0V to −11.0V in −0.5V increments. The magnitude of the temporal derivative of the weight value is plotted as a function of the weight value. The mean injection slope is +1.89.

FIG. 20 is an injection delta-weight versus weight for the pFET synapse, with source current chosen as the synapse weight. The {1,1} 72 synapse was injected up as in FIG. 15, with the source and well at +12V and the drain voltage, referenced to the source potential, stepped from −8.0V to −1 1.0V in −0.5V increments. The magnitude of the temporal derivative of the weight value is plotted as a function of the weight value. The mean injection slope is +1.89.

If a weight w is equated with the source current Is, these data show the synapse weight-update rates. Starting from the gate-current equation, EQ. 7, a learning rule that fits these data can be derived.

Tunneling Begin by taking the temporal derivative of EQ. 1:

$$\frac{\partial I_s}{\partial t} = \frac{\kappa}{Q_T} I_o e^{\frac{\kappa' V_{in}}{U_t}} e^{\frac{\kappa Q_{fg}}{Q_T}} \frac{\partial Q_{fg}}{\partial t} = \frac{\kappa}{Q_T} I_s I_g \quad \text{(EQ. 9)}$$

In the section below entitled "The Tunneling Weight-Update Rule", substitute for the tunneling gate current using EQ. 3, redefine $I_s$ as the synapse weight w, and solve for the tunneling weight-update rule:

$$\frac{\partial w}{\partial t} \approx \frac{\kappa \xi'}{Q_T} w^{(1-\sigma)} \quad \text{(EQ. 10)}$$

where $$\sigma = \frac{V_o U_t}{\kappa (V_{db} + V_{bi})^2} \quad \text{(EQ. 11)}$$

Equation 10 fits accurately the tunneling weight-update data for both synapses. In the nFET synapse, 0.12<σ<0.22; in the pFET, 0.01<σ<0.05.

Injection

Begin with EQ. 9:

$$\frac{\partial I_s}{\partial t} = \frac{\kappa}{Q_T} I_s I_g \quad \text{(EQ. 12)}$$

In the section below entitled "The Injection Weight-Update Rule", substitute for the injection gate current using EQ. 6, replace $I_s$ with w, and solve for the injection weight-update rule:

$$\frac{\partial w}{\partial t} = -\frac{\eta' \kappa}{Q_T} w^{(2-\alpha-\beta)} \quad \text{(EQ. 13)}$$

where $$\alpha = 2U_t \frac{V_\beta^2}{(V_{ds} + V_\eta)^3} \quad \text{(EQ. 14)}$$

and $$\beta = 3 \frac{U_t^2 V_\beta^2}{(V_{ds} + V_\eta)^4} \ln\left(\frac{I_s}{I_o}\right) \quad \text{(EQ. 15)}$$

Because 1 n($I_s$) changes slowly, approximate β to be constant. Equation 13 fits accurately the injection weight-update data for both synapses. In the nFET, 0.14<α+β<0.28; in the pFET, 0.08<α+β<0.14.

The Learning Rule

The synapse learning rule is obtained by adding EQS. 10 and 13, with a leading (±) added because the sign of the learning is different in the nFET and pFET synapses:

$$\frac{\partial w}{\partial t} = \pm \frac{\kappa}{Q_T} [\xi' w^{(1-\sigma)} - \eta' w^{(2-\alpha-\beta)}] \quad \text{(EQ. 16)}$$

Learning in the nFET synapse is described by selecting the (+) in EQ. 16; in the pFET synapse, the (−) is chosen.

Learning-Rate Degradation $SiO_2$ trapping is a well-known issue in floating-gate transistor reliability (see, e.g., S. Aritome, R. Shirota, G. Hemink, T. Endoh, and F. Masuoka, "Reliability issues of flash memory cells," Proc. Of the IEEE, vol. 81, no. 5, pp. 776–787, 1993). In digital EEPROM memories, it ultimately limits the transistor life. In the synapses, trapping decreases the learning rate. However, unlike the transistors in a digital memory, the synapses in a typical learning system will transport only a small quantity of total oxide charge over the system lifetime. In experiments 1 nC (nano-coulombs) of gate charge was tunneled and injected in both synapses, and resulted in a measured −20% drop in both tunneling and injection weight-update learning rates. Because 1 nC of gate charge represents an enormous change in synapse gate voltage, it appears that oxide trapping can be ignored safely in these applications.

The Tunneling Weight-Update Rule Begin with EQ. 9:

$$\frac{\partial I_s}{\partial t} = \frac{\kappa}{Q_T} I_o e^{\frac{\kappa' V_{in}}{U_t}} e^{\frac{\kappa Q_{fg}}{Q_T}} \frac{\partial Q_{fg}}{\partial t} = \frac{\kappa}{Q_T} I_s I_g \quad \text{(EQ. 17)}$$

Substitute for the gate current using EQ. 3:

$$\frac{\partial I_s}{\partial t} = \frac{\kappa \xi}{Q_T} I_o I_s (V_{dg} + V_{bi})^2 e^{-\frac{V_o}{V_{dg} + V_{bi}}} \quad \text{(EQ. 18)}$$

Approximate $V_{db} + V_{bi} \gg V_{gb}$ (where $V_{db}$ is the drain-to-bulk voltage, $V_{gb}$ is the gate-to-bulk voltage, and $V_{dg} = V_{db} - V_{gb}$), expand the tunneling exponential by $(1+x)^{-1} \sim 1-X$, and solve for the tunneling weight-update rule:

$$\frac{\partial w}{\partial t} \approx \frac{\kappa \xi}{Q_T} e^{\frac{-V_o}{V_{db} + V_{bi}}} (V_{dg} + V_{bi})^2 I_o^\sigma I_s^{(1-\sigma)} \quad \text{(EQ. 19)}$$

where $$\sigma = \frac{V_o U_t}{\kappa (V_{db} + V_{bi})^2} \quad \text{(EQ. 20)}$$

Because, for subthreshold source currents, the floating-gate voltage changes slowly, approximate $(V_{dg} + V_{bi})^2$ to be a constant. Define:

$$\xi' \equiv \xi e^{\frac{-V_o}{V_{db} + V_{bi}}} (V_{dg} + V_{bi})^2 I_o^\sigma \quad \text{(EQ. 21)}$$

Finally, substitute ξ' into EQ. 19, redefining $I_s$ as a weight w:

$$\frac{\partial w}{\partial t} \approx \frac{\kappa \xi'}{Q_T} w^{(1-\sigma)} \qquad (EQ.\ 22)$$

The Injection Weight-Update Rule
  Begin with EQ. 12:

$$\frac{\partial I_s}{\partial t} = \frac{\kappa}{Q_T} I_s I_g \qquad (EQ.\ 23)$$

In a subthreshold floating-gate MOSFET, the source current is related to the source and gate voltages, C. Mead, *Analog VLSI and Neural Systems,* Reading, Md.: Addison-Wesley, Inc., 1989, by:

$$I_s = I_o e^{\frac{\kappa V_{fg} - V_s}{U_t}} \qquad (EQ.\ 24)$$

Using EQS. 5 and 24, solve for the surface potential ψ in terms of $I_s$ and $V_s$:

$$\psi = V_s + U_t \ln\left(\frac{I_s}{I'_o}\right) \qquad (EQ.\ 25)$$

where $$I'_o \equiv I_o e^{-\frac{\psi_o}{U_t}} \qquad (EQ.\ 26)$$

Now rewrite $V_{dc}$ in terms of $V_{ds}$ and $I_s$:

$$V_{dc} = V_d - \psi = V_{ds} - U_t \ln\left(\frac{I_s}{I'_o}\right) \qquad (EQ.\ 27)$$

The gate current $I_g$ is given by EQ. 6. Add a (−) sign to the gate current, because hot-electron injection decreases the floating-gate charge, and substitute for $V_{dc}$ using EQ. 27:

$$I_g = -\eta I_s e^{-\left(\frac{V_\beta}{V_{ds}+V_\eta - U_t \ln\left(\frac{I_s}{I'_o}\right)}\right)^2} \qquad (EQ.\ 28)$$

Expand the exponent by $(1+x)^{-2} \cdot 1 - 2x - 3x^2$, and solve for $I_g$:

$$I_g \sim -\eta' I_s^{(1-\alpha-\beta)} \qquad (EQ.\ 29)$$

where:

$$\alpha = 2\frac{U_t V_\beta^2}{(V_{ds}+V_\eta)^3} \qquad (EQ.\ 30)$$

$$\beta = 3\frac{U_t^2 V_\beta^2}{(V_{ds}+V_\eta)^4} \ln\left(\frac{I_s}{I'_o}\right) \qquad (EQ.\ 31)$$

$$\eta' = \eta I_o'^{(\alpha+\beta)} e^{-\frac{V_\beta^2}{(V_{ds}+V_\eta)^2}} \qquad (EQ.\ 32)$$

Because $\ln(I_s)$ changes slowly, a reasonable approximation is to treat β as a constant. Finally, substitute EQ. 29 into EQ. 23, replacing $I_s$ with w.

$$\frac{\partial w}{\partial t} = -\frac{\eta' \kappa}{Q_T} w^{(2-\alpha-\beta)} \qquad (EQ.\ 33)$$

According to a presently preferred embodiment of the present invention, semiconductor chips embodying the analog memory of the invention are fabricated in a 2.0 micron n-well process using a p-type substrate. To make a pFET, one first creates an n-type well region within the p-type substrate. Using this process the floating-gate to source voltage $V_{gs}$ is typically about −0.8 volts (referenced to the source); the drain to source voltage $V_{ds}$ is typically −5.5 volts to −12 volts when injecting (also referenced to the source); the n-well to source volts $V_{ws}$ is typically greater than about −0.5 volts (referenced to the source); and the tunneling junction voltage $V_{tun}$ is typically about 25–45 volts more positive than the floating gate when tunneling is enabled. As oxides shrink in thickness the following parameters can be expected to hold:

$-0.3V \geq V_{gs} \geq -5V$
  $-4V \geq V_{ds} \geq -15V$ (when injecting)
  $5V \geq V_{ws} \geq -0.5V$
  $45V \geq V_{tun} \geq 9V$ (when tunneling)

The constraints to remember are that the floating-gate voltage should be more positive than the drain voltage, that $V_{ds}$ be sufficiently negative to induce hole impact ionization within the drain-source depletion region, that $V_{tun}$ be sufficiently positive to induce tunneling from the floating gate to the tunneling junction. Note $V_{gs}$ is the voltage between the floating gate and the source. The voltage on the floating gate is controlled by the voltage directly applied to the control gate, $V_{CS}$ (reference to source). $V_{CS}$ can be any value subject only to the constraint that the insulator between the floating gate and the control gate not undergo Fowler-Nordheim tunneling at any appreciable rate.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A transistor with a continuously adjustable threshold voltage, said transistor comprising:
  a source region;
  a drain region;
  a channel region disposed between said source region and said drain region;
  a drain-channel depletion region disposed in said channel region about said drain region;
  a floating gate disposed over said channel region and insulated therefrom;
  a control gate capacitively coupled to and insulated from said floating gate;
  means for applying a first potential to said source;
  means for applying a second potential to said drain;
  means for applying a third potential to said control gate, said second potential being not greater than said first potential and in a range so that the phenomenon of hole impact ionization occurs substantially in said drain-channel depletion region, said range selected so that a current of electrons injected onto said floating gate is linear in magnitude with changes in channel current between source and drain, and exponential in drain voltage.

2. A transistor according to claim 1 further comprising tunneling means for removing electrons from said floating gate.

3. A transistor with a continuously adjustable threshold voltage, said transistor comprising:
   a p– type region in a semiconductor substrate;
   a first n– type region disposed in said p– type region;
   a first p+ type source region disposed within said first n– type region;
   a second p+ type drain region disposed within said first n– type region;
   a second n– type region disposed in said p– type region, said second n– type region including an n+ type region disposed within said second n– type region within said p– type region;
   a channel disposed between said first p+ type source region and said second p+ type drain region;
   a drain-channel depletion region disposed in said channel about said second p+ type drain region;
   a floating gate disposed over said channel and separated from said channel by an insulator;
   an insulating layer disposed over said floating gate;
   a control gate conductive region disposed over said insulating layer and capacitively coupled to said floating gate;
   means for capacitively coupling a first potential to said floating gate via said control gate conductive region, said first potential referenced to said first p+ type source region;
   means for applying a second potential to said second p+ type drain region, said second potential referenced to said first p+ type source region, said second potential being in a range of from about 0 volts to about –15 volts;
   means for applying a third potential to said first n– type region, said third potential referenced to said first p+ type region, said third potential being in a range of from about –0.5 volts to about +5 volts.

4. A transistor according to claim 3 wherein hole impact ionization occurs in said drain-channel depletion region when said second potential is negative and wherein a current of electrons injected from said drain-channel depletion region changes substantially exponentially with changes in said second potential.

5. A transistor according to claim 4 wherein a portion of said floating gate is also disposed over at least a portion of said second n– type region.

6. A transistor according to claim 5 wherein a portion of said floating gate is also disposed over at least a portion of said n+ type region.

7. A transistor according to claim 5 further comprising means for selectively applying a fourth potential to said n+ region, said fourth potential referenced to said first p+ type source region, said fourth potential being in a range of from about 0 volts to about 45 volts.

8. A semiconductor structure for long-term learning comprising:
   a p– type region in a semiconductor substrate;
   a first n– type region disposed in said p– type region;
   a first p+ type region disposed within said first n– type region;
   a second p+ type region disposed within said first n– type region;
   a second n– type region disposed within said p– type region, said second n– type region including an n+ type region disposed within said second n– type region within said p– type region;
   a channel disposed between said first p+ type region and said second p+ type region;
   a floating gate disposed over said channel and separated form said channel by an insulator, a portion of said floating gate also disposed over at least a portion of said second n– type region;
   an insulating layer disposed over said floating gate;
   a gate conductive region over said insulating layer and capacitively coupled to said floating gate;
   means for capacitively coupling a first potential to said floating gate via said gate conductive region, said first potential referenced to said first p+ type region;
   means for applying a second potential to said second p+ type region, said second potential referenced to said first p+ type region, said second potential being in a range of from about 0 volts to about –15 volts;
   means for applying a third potential to said first n– type region, said third potential referenced to said first p+ type region, said third potential being in a range of from about –05 volts to about +5 volts; and
   means for selectively applying a fourth potential to said n+ type region, said fourth potential referenced to said first p+ type region, said fourth potential being in a range of from about 0 volts to about 45 volts.

9. A semiconductor structure for long-term learning according to claim 8 wherein a portion of said floating gate is disposed over at least a portion of said n+ type region.

10. A semiconductor structure for long-term learning according to claim 1 wherein a portion of said floating gate is disposed over at least a portion of said second n– type region.

11. A semiconductor structure for long-term learning comprising:
   a p– type region in a semiconductor substrate;
   a first n– type region disposed in said p– type region;
   a first p+ type region disposed within said first n– type region;
   a second p+ type region disposed within said first n– type region;
   a second n– type region disposed in said p– type region, said second n– type region including an n+ type region disposed within said second n– type region within said p– type region;
   a channel disposed between said first p+ type region and said second p+ type region;
   a floating gate disposed both above said channel and above at least a portion of said second n– type region and separated from said channel and said portion of said second n– type region by an insulator;
   an insulating layer disposed over said floating gate;
   a gate conductive region disposed over said insulating layer and capacitively coupled to said floating gate;
   means for capacitively coupling a first potential to said floating gate via said gate conductive region, said first potential referenced to said first p+ type region, said first potential being in a range of from about –0.3 volts to about –2 volts;
   means for applying a second potential to said second p+ type region, said second potential referenced to said first p+ type region, said second potential being in a range of from about 0 volts to about –15 volts;
   means for applying a third potential to said first n– type region, said third potential referenced to said first p+ type region, said third potential being in a range of from about −0.5 volts to about +5 volts; and means for selectively applying a fourth potential to said n+ type region, said fourth potential referenced to said first p+ type region, said fourth potential being in a range of from about 0 volts to about 45 volts.

12. A semiconductor structure for long-term learning according to claim 11 wherein a portion of said floating gate is disposed over at least a portion of said n+ type region.

13. A semiconductor structure for long-term learning according to claim 3 wherein a portion of said floating gate is disposed over at least a portion of said second n− type region.

14. A semiconductor structure for long-term learning comprising:

a p− type region in a semiconductor substrate;

a first and second n− type well region disposed within said p− type region;

a p+ type source region disposed within said first n− type well region;

a p+ type drain region disposed within said first n− type well region;

an n+ type tunneling junction region disposed within said second n− type well region;

a channel disposed between said source region and said drain region;

a floating gate disposed over said channel and over said n+ type tunneling junction region, said floating gate disposed adjacent to at least one edge of each of said drain region, said source region and said n+ type tunneling junction region, and separated from said semiconductor substrate by a gate oxide under a portion of said floating gate including at least where it is adjacent to an edge of each of said drain region, said source region and said n+ type tunneling junction region;

an insulating layer disposed over said floating gate;

a gate conductive region disposed over said insulating layer and capacitively coupled to said floating gate;

means for capacitively coupling a first potential to said floating gate via said gate conductive region, said first potential referenced to said p+ type source region;

means for applying a second potential to said p+ type draw region, said second potential referenced to said p+ type source region, said second potential being in a range of from about 0 volts to about −15 volts;

means for applying a third potential to said first n− type well region, said third potential referenced to said p+ type source region, said third potential being in a range of from about −0.5 volts to about +5 volts; and means for selectively applying a fourth potential to said n+ type tunneling junction region, said fourth potential referenced to said p+ type source region, said fourth potential being in a range of from about 0 volts to about 45 volts.

15. A semiconductor structure for long-term learning according to claim 14 wherein a portion of said floating gate is disposed over at least a portion of said n+ type tunneling junction region.

16. A semiconductor structure for long-term learning according to claim 5 wherein a portion of said floating gate is disposed over at least a portion of said second n− type region.

17. A semiconductor structure for long-term learning according to claim 8 wherein said means for capacitively coupling a first potential to said floating gate comprises a conductor coupled to said floating gate by a first capacitance.

18. A semiconductor structure for long-term learning according to claim 8 wherein said insulator is a layer of gate oxide.

19. A semiconductor structure for long-term learning according to claim 14 wherein said means for capacitively coupling a first potential to said floating gate comprises a conductor coupled to said floating gate by a first capacitance.

20. A semiconductor structure for long-term learning according to claim 19 wherein said insulator is a layer of gate oxide.

21. A semiconductor structure for long-term learning comprising:

a p− type region in a semiconductor substrate;

a first and a second n− type well region disposed within said p− type region;

a p+ type source region disposed in said first n− type well region;

a p+ type drain region disposed in said first n− type well region;

a channel disposed between said first p+ type source region and said second p+ type drain region;

a floating gate disposed over said channel and separated from said channel by an insulator;

an insulating layer disposed over said floating gate;

a first conductive region disposed over said insulating layer and capacitively coupled to said floating gate;

a tunneling junction disposed between said floating gate and an n+ type region disposed within said second n− type well region, a second conductive region connected to said n+ type region;

means for capacitively coupling a first potential to said floating gate via said first conductive region, said first potential referenced to said p+ type source region;

means for applying a second potential to said p+ type drain region, said second potential referenced to said p+ type source region, said second potential being in a range of from about 0 volts to about −15 volts;

means for applying a third potential to said first n− type well region, said third potential referenced to said p+ type source region, said third potential being in a range of from about −0.5 volts to about +5 volts; and means for selectively applying a fourth potential to said second conductive region, said fourth potential referenced to said p+ type source region, said fourth potential being in a range of from about 0 volts to about 45 volts.

22. A semiconductor structure for long-term learning comprising:

a semiconductor substrate including a p− type region;

a first and a second n− type well region disposed within said p− type region;

a first p+ type region disposed in said first n− type well region;

a second p+ type region disposed in said first n− type well region;

a channel disposed between said first p+ type region and said second p+ type region;

a floating gate disposed above said channel and extending over a portion of said first and second p+ type regions and separated from said channel and said p+ doped regions by a layer of gate oxide;

an insulating layer disposed over said floating gate;

a first conductive region disposed over said insulating layer and capacitively coupled to said floating gate;

a tunneling junction disposed between said floating gate and an n+ type region disposed within said second n– type well region, a layer of gate oxide separating said floating gate and said n+ type region;

means for capacitively coupling a first potential to said floating gate via said first conductive region said first potential referenced to said p+ type region;

means for applying a second potential to said second p+ type region, said second potential referenced to said p+ type region, said second potential being in a range of from about 0 volts to about –15 volts;

means for applying a third potential to said first n– type well region, said third potential referenced to said p+ type source region, said third potential being in a range of from about –0.5 volts to about +5 volts; and means for selectively applying a fourth potential to said second n+ type region, said fourth potential referenced to said p+ type region, said fourth potential being in a range of from about 0 volts to about 45 volts.

23. A semiconductor substrate including a p– type region;

a first and a second n– type well region disposed in said p– type region;

a first p+ type region dispose din said first n– type well region;

a second p+ type region disposed in said first n– type well region;

a channel disposed between said first p+ type region and said second p+ type region;

a floating gate disposed above said channel and separated from said channel by a first insulating layer;

a second insulating layer disposed over said floating gate;

a first conductive region disposed over said second insulating layer and capacitively coupled to said floating gate;

means for capacitively coupling a first potential to said floating gate via said first conductive region, said first potential referenced to said first p+ type region;

means for applying a second potential to said second p+ type region, said second potential referenced to said first p+ type region, said second potential being in a range of from about 0 volts to about –15 volts;

means for applying a third potential to said first n– type region, said third potential referenced to said first p+ type region, said third potential being in a range of from about –0.5 volts to about +5 volts;

means for selectively applying a fourth potential to a second conductive region, said fourth potential referenced to said first p+ type region, said fourth potential being in a range of from about 0 volts to about 45 volts; and a tunneling junction for causing electrons to tunnel from said floating gate to said second conductive region in response to selective application of said fourth potential to said second conductive region.

24. A semiconductor structure for long-term learning comprising:

a p– type region in a semiconductor substrate;

a first n– type well region disposed in said p– type region;

a first p+ type region disposed in said first n– type well region;

a second p+ type region disposed in said first n– type well region;

a floating gate disposed over a channel region and separated from said channel region by a first insulating layer, said channel region disposed in said first n– type well region between said first p+ type region and said second p+ type region;

means for capacitively coupling a negative potential to said floating gate, said negative potential referenced to said first p+ type region, said negative potential having a value in a range of about –0.3 volts to about –5.0 volts;

a tunneling junction region disposed adjacent to a portion of said floating gate;

a second insulating layer disposed over said floating gate; and a conductive region disposed over said second insulating layer and capacitively coupled to said floating gate.

25. The semiconductor structure according to claim 24 wherein said tunneling junction comprises a second conductive region separated from said floating gate by an insulating material.

26. A semiconductor structure for long-term learning comprising:

a p– type region in a semiconductor substrate;

a first and a second n– type well region disposed in said p– type region;

a first p+ type region disposed in said first n– type well region;

a second p+ type region disposed in said first n– type well region;

said second n– type well region including an n+ type region surrounded by said second n– type well region within said p– type region;

a floating gate disposed over a channel region and separated from said channel region by a first insulating layer, said channel region disposed in said first n-type well region between said first p+ type region and said second p+ type region;

means for capacitively coupling a negative potential to said floating gate, said negative potential referenced to said first p+ type region, said negative potential having a value in the range of about –0.3 to about –5.0 volts;

a second insulating layer disposed over said floating gate; and a conductive region disposed over said second insulating layer and capacitively coupled to said floating gate.

27. A semiconductor structure for long-term learning comprising:

a p– type region in a semiconductor substrate;

a first n– type well region disposed in said p– type region;

a first p+ type region disposed in said first n– type well region;

a second p+ type region disposed in said first n– type well region;

a floating gate disposed over a channel region and separated from said channel region by a first insulating layer, said channel region disposed in said first n– type well region between said first p+ type region and said second p+ type region;

a tunneling junction region disposed adjacent to a portion of said floating gate, said tunneling junction region including a first conductive region separated from said floating gate by an insulating material;

a second insulating layer disposed over said floating gate;

a second conductive region disposed over said second insulating layer and capacitively coupled to said floating gate;

means for selectively causing electrons to inject from said channel region through said first insulating layer onto said floating gate; and means for selectively causing electrons to tunnel from said floating gate through said tunneling junction region.

28. The semiconductor structure according to claim 27 including means for simultaneously causing said electron injection and said electron tunneling.

29. A semiconductor structure for long-term learning comprising:

a p− type region in a semiconductor substrate;

a first n− type well region disposed in said p− type region;

a first p+ type region disposed in said first n− type well region;

a second p+ type region disposed in said first n− type well region;

a second n− type well region disposed in said p− type region, said n− type well region including an n+ type region surrounded by said n− type well region within said p− type region;

a floating gate disposed over a channel region and separated from said channel region by a first insulating layer, said channel region disposed in said p− type region between said first p+ type region and said second p+ type region;

a second insulating layer disposed over said floating gate;

a gate conductive region disposed over said second insulating layer and capacitively coupled to said floating gate;

means for selectively causing electrons to inject from said channel implant region through said first insulating layer into said floating gate; and means for selectively causing electrons to tunnel from said floating gate to said n+ doped region through said first insulating layer.

30. The semiconductor structure according to claim 29 including means for simultaneously executing said electron injection and said electron tunneling.

31. A semiconductor structure for long-term learning comprising:

a p− type region in a semiconductor substrate;

a first n− type well region disposed in said p− type region;

a first p+ type region disposed in said first n− type well region;

a second p+ type region disposed in said first n− type well region;

a floating gate disposed over a channel region and separated from said channel region by a first insulating layer, said channel region disposed in said first n− type well region between said first p+ type region and said second p+ type region;

a tunneling junction region disposed adjacent to a portion of said floating gate, said tunneling junction region including a second conductive region separated from said floating gate by an insulating material;

a second insulating layer disposed over said floating gate;

a gate conductive region disposed over said second insulating layer and capacitively coupled to said floating gate; and means for simultaneously adding and removing electrons to and from said floating gate, wherein said electron addition is accomplished through selective use of electron injection and said electron removal is accomplished through selective use of electron tunneling.

32. In a semiconductor device having a lattice, a source, a control gate terminal and a drain, said source and drain disposed in p+ type regions of an n− type well region in a p− type region of a semiconductor substrate and said control gate terminal capacitively coupled to a floating gate disposed over and insulated from a channel region existing between said source and said drain, a method of injecting electrons onto said floating gate comprising the steps of:

applying a first potential to said drain, said first potential referenced to said source, said first potential being in a range of about 0 to about −15 volts;

applying a second potential to said control gate terminal; and thereby causing hole charge carriers to accelerate from said drain toward said source in said channel region, collide with the semiconductor lattice, and thereby cause hole impact ionization, liberating electrons in the channel region for injection onto said floating gate.

33. A method according to claim 32 further comprising the step of:

applying a third potential to such n− type well region, said third potential referenced to said source, said third potential being in a range of about −0.5 volts to about +5.0 volts.

* * * * *

UNITED STATES PATENT AND TRADEMARK OFFICE
CERTIFICATE OF CORRECTION

PATENT NO.  : 5,990,512
DATED       : November 23, 1999
INVENTOR(S) : Christopher J. Diorio, Paul E. Hasler, Bradley A. Minch, and Carver A. Mead It is certified that error appears in the above-identified patent and that said Letters Patent is hereby corrected as shown below:

Col. 9, line 24, replace "Md." with --Ma.--.

Col. 9, line 43, replace "ic" with --κ--.

Col. 11, line 64, replace "ϕ" with --φ--.

Col. 13, line 47, replace "$V_{gb>>Vdb}$" with --$V_{gb} >> V_{db}$--.

Col. 16, line 7, in Table 2, the first entry under "Col. 1 Source" replace "1" with --0--.

Col. 16, line 7, in Table 2, the first entry under "Row 1 tun", insert an --0--.

Col. 16, line 11, replace "$_s$" with --$I_s$--.

Col. 17, lines 5-6, replace "-1 1.0V" with -- -11.0V--.

Col. 17, line 64, replace "1 n($I_s$)" with --ln($I_s$)--.

Col. 19, line 15, replace "Md." with --Ma.--.

UNITED STATES PATENT AND TRADEMARK OFFICE
CERTIFICATE OF CORRECTION

PATENT NO. : 5,990,512
DATED : November 23, 1999
INVENTOR(S) : Christopher J. Diorio, Paul E. Hasler, Bradley A. Minch, and Carver A. Mead It is certified that error appears in the above-identified patent and that said Letters Patent is hereby corrected as shown below:

Col. 19, line 49: In the equation (not numbered), replace "$(1+x)^{-2} \cdot 1 - 2x - 3x^2$"

with --$(1+x)^{-2} \approx 1 - 2x - 3x^2$--.

Col. 19, line 65, replace "1 n($I_s$)" with --ln($I_s$)--.

Signed and Sealed this

Tenth Day of April, 2001

Attest:

NICHOLAS P. GODICI

Attesting Officer   Acting Director of the United States Patent and Trademark Office